United States Patent
Oohashi et al.

(10) Patent No.: US 7,728,366 B2
(45) Date of Patent: Jun. 1, 2010

(54) PHOTODIODE AND METHOD FOR FABRICATING SAME

(75) Inventors: Keishi Oohashi, Tokyo (JP); Tsutomu Ishi, Tokyo (JP); Toshio Baba, Tokyo (JP); Junichi Fujikata, Tokyo (JP); Kikuo Makita, Tokyo (JP)

(73) Assignee: NEC Corporation (JP)

( * ) Notice: Subject to any disclaimer, the term of this patent is extended or adjusted under 35 U.S.C. 154(b) by 379 days.

(21) Appl. No.: 10/599,609

(22) PCT Filed: Apr. 5, 2005

(86) PCT No.: PCT/JP2005/006660
§ 371 (c)(1),
(2), (4) Date: Oct. 3, 2006

(87) PCT Pub. No.: WO2005/098966
PCT Pub. Date: Oct. 20, 2005

(65) Prior Publication Data
US 2007/0194357 A1    Aug. 23, 2007

(30) Foreign Application Priority Data
Apr. 5, 2004    (JP) ............................. 2004-111403

(51) Int. Cl.
*H01L 31/113* (2006.01)
(52) U.S. Cl. .................... 257/292; 257/E33.076
(58) Field of Classification Search .......... 257/292, 257/233, 462, E25.032, E33.076, E31.065, 257/E31.125, E31.058, E31.063, E31.115, 257/E27.133–E33.139
See application file for complete search history.

(56) References Cited

U.S. PATENT DOCUMENTS

| | | | |
|---|---|---|---|
| 4,864,119 A | 9/1989 | Ragle et al. | 250/211 |
| 5,451,769 A | 9/1995 | McAdoo et al. | 250/214.1 |
| 6,236,033 B1 | 5/2001 | Ebbesen et al. | 250/216 |
| 6,334,716 B1* | 1/2002 | Ojima et al. | 385/89 |
| 2003/0011722 A1* | 1/2003 | Kasama et al. | 349/43 |
| 2003/0072245 A1* | 4/2003 | Ueyanagi | 369/112.24 |

(Continued)

FOREIGN PATENT DOCUMENTS

JP    59-108374    6/1984

(Continued)

OTHER PUBLICATIONS

Fujikata, et al., "Surface Plasmon Enhancement Effect and Its Application to Near-Field Optical Recording", Trans. Magn. Soc. Jpn., vol. 4, No. 4-2, 2004.

(Continued)

*Primary Examiner*—Sue Purvis
*Assistant Examiner*—Selim Ahmed
(74) *Attorney, Agent, or Firm*—Hayes Soloway P.C.

(57) ABSTRACT

A Schottky photodiode includes a semiconductor layer and a conductive film provided in contact with the semiconductor layer. The conductive film has an aperture and a periodic structure provided around said aperture for producing a resonant state by an excited surface plasmon in a film surface of the conductive film by means of the incident light to the film surface. The photodiode detects near-field light that is generated by at the interface between the conductive film and semiconductor layer the excited surface plasmon. The aperture has a diameter smaller than the wavelength of the incident light.

29 Claims, 16 Drawing Sheets

U.S. PATENT DOCUMENTS

| | | | |
|---|---|---|---|
| 2003/0160250 A1 | 8/2003 | Cova et al. | 257/80 |
| 2003/0173501 A1 | 9/2003 | Thio et al. | 250/216 |
| 2003/0185135 A1* | 10/2003 | Fujikata et al. | 369/112.21 |
| 2004/0151442 A1* | 8/2004 | Scruggs et al. | 385/92 |

FOREIGN PATENT DOCUMENTS

| | | |
|---|---|---|
| JP | 08-204225 | 8/1996 |
| JP | 08-204226 | 8/1996 |
| JP | 10-509806 | 9/1998 |
| JP | 2000-171763 | 6/2000 |
| JP | 2000-222765 | 8/2000 |
| JP | 2001-291265 | 10/2001 |
| JP | 2002-076410 | 3/2002 |
| JP | 2003-287656 | 10/2003 |
| JP | 2004-061880 | 2/2004 |
| JP | 2004-70288 | 3/2004 |

OTHER PUBLICATIONS

"Transactions of the Magnetics Society of Japan", Selected Papers from Magneto-Optical Recording International Symposium, vol. 4, No. 4-2, No. 15 (2004) http://www.nil.ac.jp/msj2, Nov. 2004.

* cited by examiner

PHOTODIODE AND METHOD FOR FABRICATING SAME

TECHNICAL FIELD

The present invention relates to a photodiode for converting light signals that include invisible light such as infrared light to electrical signals at high speed, and to a method for fabricating the same.

BACKGROUND ART

Photodiodes are frequently used as devices for converting optical signals to electrical signals at high speed. Photodiodes are indispensable in the fields of information processing and communication.

Various types of photodiodes are known, but a representative example of a photodiode for operating at high speed is the pin-type photodiode. As shown in FIG. 1, a pin-type photodiode is constituted from a semiconductor such as silicon and is of a configuration in which i-layer (intrinsic semiconductor layer) 51 is interposed between p-layer (p-type semiconductor layer) 52 and n-layer (n-type semiconductor layer) 53. P-layer 52 is formed as a thin layer on a portion of the surface of i-layer 51, and first electrode (anode electrode) 54 with window 59 formed in its center is provided so as to both enclose the periphery of p-layer 52 and contact p-layer 52. Second electrode (cathode electrode) 55 is provided on the surface of n-layer 53 that is not the i-layer 51 side. P-layer 52 is exposed on the bottom surface of window 59, and antireflection film 58 is provided on the exposed surface of p-layer 52.

Load resistance 50 and this pin-type photodiode are connected in a series to bias power supply 56, and when a reverse bias voltage is applied to the photodiode by bias power supply 56 such that the first-electrode 54 side is negative and the second-electrode 55 side is positive, substantially the entire region of i-layer 51 of high resistance becomes a depletion layer of the electric charge carrier. When incident light 57 irradiates the interior of the photodiode by way of window 59 in this state, the photons of incident light 57 are mainly absorbed by i-layer 51 to generate electron-hole pairs. The generated electrons and holes each drift in opposite directions within the depletion layer under the influence of the reverse bias voltage to generate a current, and are detected as a signal voltage between both ends of load resistance 50.

The chief factors that limit the response speed of the photoelectric conversion of such a pin-type photodiode are a circuit time constant that is determined by the product of load resistance 50 and the electrical capacitance produced by the depletion layer and the carrier transit time needed for the electrons and holes to pass through the depletion layer. Thus, in order to improve the response time, either the circuit time constant should be reduced or the carrier transit time should be shortened.

Schottky photodiodes are sometimes used to improve the response speed by shortening the carrier transit time. As shown in FIG. 2, a Schottky photodiode is composed of a semiconductor such as silicon, $n^-$-type semiconductor layer 61 being formed on $n^+$-type semiconductor layer 60, and further, semi-transparent metal film 66 being provided on a portion of the surface of $n^-$-type semiconductor layer 61 so as to contact $n^-$-type semiconductor layer 61. Semi-transparent metal film 66 is a metal thin-film thin enough to transmit incident light 67. First electrode 62 in which window 69 is formed in the center is provided so as to both surround the periphery of semi-transparent metal film 66 and contact semi-transparent metal film 66. Second electrode 63 is provided on the surface of $n^+$-type semiconductor layer 60 that is not the $n^-$-type-semiconductor layer 61 side. Semi-transparent metal film 66 is exposed on the bottom of window 69, and antireflection film 68 is provided on the exposed surface of semi-transparent metal film 66. As in the case of the pin-type photodiode shown in FIG. 1, a reverse bias voltage is applied by way of bias power supply 64 and load resistance 65 to first electrode 62 and second electrode 63.

In this type of Schottky photodiode, a Schottky barrier is generated in the vicinity of the interface in which $n^-$-type semiconductor layer 61 contacts semi-transparent metal film 66. In the vicinity of this Schottky barrier, electrons are diffused from semi-transparent metal film 66 and toward $n^-$-type semiconductor layer 61 to generate a depletion layer. When incident light 67 is irradiated in this state, electrons are generated in $n^-$-type semiconductor layer 61, and these electrons drift within the depletion layer under the influence of the reverse bias voltage. The drift of the electrons within the depletion layer generates a current and is detected as a signal voltage between the two ends of the load resistance 65.

In addition, the light absorption in the device surface layer can be effectively used in a Schottky photodiode.

On the other hand, when the circuit time constant is reduced to improve the response speed of photoelectric conversion, either the load resistance should be reduced or the electrical capacitance of the depletion layer should be reduced. However, when the load resistance is reduced to shorten the circuit time constant, the voltage level of the regeneration signal that can be extracted drops, the device becomes more susceptible to the effect of thermal noise and other noises, and the SN ratio (signal-to-noise ratio) is degraded. Thus, reducing the electrical capacitance of the depletion layer results in the necessity to improve the SN ratio of the regeneration signal to reduce read errors. In particular, when the depletion layer is thinned to shorten the carrier transit time, the electrical capacitance increases, and as a result, the area of the depletion layer or the Schottky junction must be reduced to obtain higher speeds. However, decreasing the junction area reduces the utilization of the signal light, and this in turn gives rise to the problem of degradation of the SN ratio of the regeneration signal. Although a lens can be used to condense and improve the utilization of the signal light, the provision of a lens not only increases the size of the photoelectric conversion device itself, but also entails the difficult operations of aligning the lens and photodiode and positioning the lens and optical fiber.

In response to these problems, various attempts have been made with the development of technology in recent years to achieve a photoelectric conversion device of this type that is capable of higher speeds and more compact sizes than the prior art through the use of a metal surface plasmon JP-A-59-108376 (Patent Document 1) discloses a photodetector that is composed of a metal/semiconductor/metal (MSM) device in which two electrodes are disposed on the same surface of a semiconductor. This MSM photodetector is generally a type of Schottky photodiode having a Schottky barrier in the vicinity of the two electrodes. A portion of the light transmitted by the electrodes is absorbed; by the semiconductor to generate free electrons. This type of MSM photodetector suffers from the problem that increasing the thickness of the semiconductor to raise the quantum efficiency causes an increase in the propagation distance of electrons and a consequent drop in the operation speed. To prevent this drop in operation speed, JP-A-59-108376 discloses an arrangement in which metal electrodes are provided along periodic surface irregularities to achieve efficient coupling of incident light and the surface plasmon of the metal electrodes and propagate the light within the photodetector. As one method of application to the fabrication of the above-described MSM photoreception device, JP-A-08-204225 (Patent Document 2) discloses a method for forming a metal film on a semiconductor and then oxidizing a portion of the metal film to form a phototransmissive insulation pattern.

A photoreception device that detects near-field light has also been proposed. JP-A-08-204226 (Patent Document 3) discloses an MSM photoreception device having a pair of conductive voltage application members on the same surface of a semiconductor in which the width of a phototransmissive insulation pattern separating the pair of conductive voltage application members is set to a dimension equal to or less than the wavelength and in which the near-field light generated from the ends of conductive voltage application members on the both sides of the phototransmissive insulation pattern is used to raise the response speed of photodetection. The conductive voltage application members are generally constituted by a metal film. In this configuration, the width of the opening for generating near-field light determines the efficiency and the distance of drift of electrons in the depletion layer determines the response speed, but because the width of the phototransmissive insulation pattern is the width of the depletion layer as a Schottky photodiode, the width of the opening and the distance of drift of electrons cannot be independently set and high efficiency and high speed therefore cannot be simultaneously obtained in the photoreception device.

JP-A-10-509806 (Patent Document 4) discloses a photoelectric coupler in which the surface plasmon phenomenon is used. In this photoelectric coupler, a device configuration is employed in which interdigital metal electrodes aligned with regular spacing on a semiconductor are arranged such that positive electrodes and negative electrodes confront each other with one fitting into the other. By means of this device configuration, incident light, transmitted light, reflected Flight, surface plasmon and the like are coupled with each other by resonance. In an MSM photoreception device of this type that uses photoelectric coupling technology, free electrons generated by incident light are enhanced by the coupling of incident light and surface plasmon, but when the area irradiated by incident light is reduced to reduce the electric capacitance of the depletion layer, the strength of the detected signal falls and the SN ratio drops.

JP-A-2002-076410 (Patent Document 5) discloses a photovoltaic device for converting the energy of sunlight to electrical energy in which a plurality of micro-semiconductors having a spherical or hemispherical shape and having pn bonding are used, each semiconductor sphere being interposed between a pair of electrodes and periodically arranged openings or depressions being provided on one of the pair of electrodes. The periodic shape provided on one of the electrodes causes the incident light and the surface plasmon to resonate, thus improving the photoelectric conversion efficiency of photovoltaic device as a whole. However, this technique relates to a photovoltaic device, i.e., a solar battery, in which high speed is not required in the response speed of photoelectric conversion. As a result, no investigation has been conducted into reducing the thickness of the depletion layer or reducing the size of the photoelectric conversion area to achieve an increase in the speed of photoelectric conversion.

As a device that uses the interaction of incident light and a surface plasmon, JP-A-2000-171763 (Patent Document 6) discloses an optical transmission device in which a metal film having an aperture and periodic surface variations is used to greatly enhance the intensity of light that is propagated through the aperture. This publication states that, even with a single aperture, the provision of rows of periodic grooves around the aperture enables greater enhancement of light that is propagated through the aperture than a case that lacks periodic rows of grooves. However, it is known that in surface plasmon resonance, the total energy of transmitted light is attenuated compared to the incident light energy. According to Tineke Thio, H. J. Lezec, T. W. Ebbesen, K. M. Pellerin, G. D. Lewen, A. Nahata, and R. A. Linke in "Giant optical transmission of sub-wavelength apertures: physics and applications," Nanotechnology, Vol. 13, pp. 429-432 (Non-Patent Document 1), the total energy of light that is transmitted through an aperture having a diameter of 40% of the wavelength or less is attenuated to 1% or less of the incident light energy despite the use of surface plasmon resonance. As a result, a high SN ratio cannot be obtained in photoelectric conversion even when the optical transmission device disclosed in JP-A-2000-171763 is used to irradiate light that has been propagated from the aperture of the optical transmission device onto a photoreception device.

JP-A-2001-291265 (Patent Document 7) discloses a read/write head for an optical data recording medium that, by using near-field optics to improve the recording density of an optical data storage medium, both irradiates light onto an optical recording medium by way of an opening having diameter equal to or less than the wavelength and enhances the intensity of light transmitted through the aperture by means of the above-described surface plasmon resonance. In JP-A-2004-061880 (Patent Document 8), it is described that the read/write head disclosed in the above-described JP-A-2001-291265 does not use transmitted light that has passed through the aperture and then propagated to a remote location, but rather, uses a minute light spot that is formed in proximity to the aperture by near-field light (evanescent light). In the case of an optical data storage medium, the absorption coefficient of light in the storage medium can be raised to a high level, whereby all photons within a minute range such as a light spot produced by near-field light can be absorbed in the storage medium to enable the formation of minute recording pits. However, it is believed that when near-field light is introduced into a photodiode, the relatively low light absorption coefficient of the material that makes up the photodiode prevents irradiation of light to positions deep in the photodiode, whereby a sufficient photodetection current is not observed.

The reference documents cited in the present specification are listed below:

Patent Document 1: Japanese Patent Application Laid-open No. Sho-59-108376 (JP-A-59-108376);

Patent Document 2: Japanese Patent Application Laid-open No. Hei-8-204225 (JP-A-08-204225);

Patent Document 3: Japanese Patent Application Laid-open No. Hei-8-204226 (JP-A-08-204226);

Patent Document 4: Japanese Patent Application Laid-open No. Hei-10-509806 (JP-A-10-509806);

Patent Document 5: Japanese Patent Application Laid-open No. 2002-76410 (JP-A-2002-076410);

Patent Document 6: Japanese Patent Application Laid-open No. 2000-171763 (JP-A-2000-171763);

Patent Document 7: Japanese Patent Application Laid-open No. 2001-291265 (JP-A-2001-291265);

Patent Document 8: Japanese Patent Application Laid-open No. 2004-61880 (JP-A-2004-061880);

Non-Patent Document 1: Tineke Thio, H. J. Lezec, T. W. Ebbesen, K. M. Pellerin, G. D. Lewen, A. Nahata, and R. A.

Linke, "Giant optical transmission of sub-wavelength apertures: physics and applications," Nanotechnology, Vol. 13, pp. 429-432.

DISCLOSURE OF THE INVENTION

Problem to be Solved by the Invention

Increasing the speed of response of a photodiode necessitates reducing the thickness of the depletion layer to shorten the carrier transit time and reducing the area of the depletion layer to decrease the circuit time constant. However, the adoption of these measures results in a drop in the quantum efficiency of converting the photons of incident light to electron-hole pairs, i.e., the utilization of the signal light, and entails the problem of a drop in the SN ratio. In particular, when the size of the window of light incidence is set to a size equal to or less than the wavelength to reduce the area of the depletion layer, the intensity of light that is transmitted is greatly attenuated due to the diffraction limit, and it is therefore nearly impossible to set the junction area of the photodiode to 1 $\mu m^2$ or less. Even when an aperture is provided in a metal film, a periodic structure is provided in the metal film in the vicinity of the aperture, surface plasmon resonance is used to raise the intensity of light transmitted through the aperture, and the light that has been thus intensified then introduced into the photodiode, a drop in the SN ratio is observed and sufficient light intensity is not obtained. Even when attempting to detect near-field light that is formed in the vicinity of an aperture provided in a metal film, it is believed that the relatively low light absorption coefficient of the semiconductor material that makes up the photodiode prevents sufficient light intensity from being obtained.

In this type of photoreception device, the dark current that flows even in the absence of a signal light becomes a problematic source of noise. Dark current flows as a result of the generation of charge carrier due to heat and the like and is therefore highly dependent on temperature. The greater the volume of the region that generates electron-hole pairs, the greater the dark current. The inability to implement lattice matching of the metal and semiconductor in a Schottky photodiode further produces a type of lattice defect in the depletion layer. This defect acts as the generation center of charge carrier and thus acts to increase dark current.

It is an object of the present invention to provide a device structure for increasing the response speed of a photodiode while maintaining signal intensity.

It is another object of the present invention to provide a photodiode that, compared to the prior art, not only provides a structure that facilitates integration by greatly miniaturizing the device, but that further enables higher speeds, lower power consumption, and lower noise.

Means For Solving The Problem

According to the first aspect of the present invention, a photodiode includes: a conductive film having an aperture having a diameter smaller than the wavelength of incident light and a periodic structure provided around the aperture for producing a resonant state by an excited surface plasmon in a film surface of the conductive film by means of the incident light to the film surface; and a semiconductor layer provided in the vicinity of the aperture of the conductive film and in contact with the conductive film; wherein the photodiode detects near-field light that is generated at an interface between the conductive film and the semiconductor layer by the excited surface. In this photodiode, the diameter of the aperture is preferably at least 1/10 the wavelength of incident light but not greater than ½ the wavelength of incident light. The region in which a Schottky barrier formed by the conductive film and the semiconductor layer appears preferably substantially matches a region of generation of the near-field light. The periodic structure is preferably composed of surface irregularities that have a period in the direction of increasing distance from the aperture.

According to the second mode of the present invention, a photodiode is characterized in that it comprises: a conductive film having a first surface and a second surface and including an aperture having a diameter smaller than the wavelength of incident light that is formed from the first surface side; and a periodic structure composed of surface irregularities having a period in the direction of increasing distance from the aperture; a first semiconductor layer of one conductive type provided in the vicinity of the aperture of the conductive film and in contact with the second surface of the conductive film; and a second semiconductor layer of the conductive type in which concentration of impurities is higher than in the first semiconductor layer, and which contacts a surface of the first semiconductor layer that is opposite to another surface in contact with the second surface of the conductive film.

The photodiode may further include a first electrode electrically connected to the first semiconductor layer and a second electrode electrically connected to the conductive film for applying a reverse bias voltage to form a Schottky barrier in the vicinity of the junction with the conductive film of the first semiconductor layer. In addition, the thickness of the first semiconductor layer interposed between the second semiconductor layer and the conductive film is preferably equal to or less than the length of the bleeding of near-field light that appears on the first-surface side at the location of the aperture when light is irradiated from the first surface onto the conductive film. More specifically, the thickness of the second semiconductor layer is, for example, equal to or greater than 50 nm and equal to or less than 100 nm.

In this photodiode, the conductive film is preferably composed of a metal film, and the surface irregularities are preferably formed on the first surface. The periodic structure is composed of, for example, concentric grooves that take the aperture as center. The aperture preferably has a diameter of at least 1/10 but no greater than ½ the wavelength of incident light.

In the photodiode of the present invention, a conductive member may be included having a dimension that is smaller than the wavelength of incident light at a location separated by a distance shorter than the wavelength of incident light from the Schottky junction composed of the first semiconductor layer and the conductive film.

In the photodiode of the present invention, a transparent film having substantially the same index of refraction as the first semiconductor layer may be provided on the first surface of the conductive film, and further, an antireflection film for the incident light may be provided.

The period of the periodic structure is preferably no greater than the wavelength of incident light, or is preferably set to the resonance wavelength of the surface plasmon excited on the conductive film by the incident light.

The thickness of the metal film is, for example, at least 100 nm but not greater than 1000 nm in concave portions of the periodic structure, and the depth of the surface irregularities in the periodic structure is, for example, at least 20 nm but not greater than 200 nm.

In the present invention, the planar shape of the aperture formed in the conductive film may be a circle, an oval, an ellipse, a dumbbell shape in which the central portion is constricted, or a slit. When the aperture is an oval, the minor axis of the oval should be made equal to or less than the wavelength of incident light. When a slit-shaped aperture is used, the distance between the two opposing sides of the slit should be equal to or less than the wavelength.

In the present invention, moreover, insulation material, for example, an oxide in film or cluster form having a diameter on the order of 2 nm or less, may be present in a range that does not impede the operation of the photodiode at the interface of the Schottky junction that is formed by the conductive film and the semiconductor layer.

The fabrication method of the photodiode of the present invention is a fabrication method of a photodiode that includes: a conductive film having an aperture and periodic surface irregularities that center on the aperture; and a semiconductor layer that is joined to the conductive film at the bottom of the aperture; the fabrication method including the steps of: defining and forming the semiconductor layer such that the region for performing photoelectric conversion is limited to the position that corresponds to the bottom of the aperture; forming the conductive film; and forming the aperture and the surface irregularities in the conductive film such that the aperture and the surface irregularities are matched to the region.

In general, light that is incident to a metal film having a minute aperture equal to or less than the wavelength is nearly unable to pass through the aperture. However, as described above, it is known that the intensity of transmitted light can be enhanced by providing a periodic surface irregularities around the minute aperture and then coupling the incident light with the surface plasmon of the metal film to enable the production of a resonant state. This effect is referred to as the "plasmon enhancement." However, according to the above-described paper of Tineke Thio et al. (Non-Patent Document 1), the total energy of light that passes through an aperture having a diameter of 40% or less of the wavelength is attenuated to 1% or less of the energy of the incident light, and a practical high SN ratio therefore cannot be obtained by irradiating a semiconductor with only the transmitted light from, a minute aperture.

On the other hand, the bleeding phenomenon of photons referred to as near-field light (evanescent light) occurs in the vicinity of the outlet of the minute aperture. Plasmon enhancement resulting from periodic surface irregularities is believed to greatly enhance this near-field light in addition to the transmitted light. As a result, the production of strong near-field light that attenuates exponentially within a narrow range of approximately 100 nm or less as the bleeding length (i.e., the distance from the position of the outlet) can be expected in the vicinity of the outlet of the minute aperture, this near-field light being in a range of the same order as the area of the aperture in planar spread. In this case, the minute aperture need not completely penetrate the metal film, and a metal layer on the order of 10 nm may remain at the bottom of the aperture, the near-field light surpassing this metal layer and appearing on the outlet side. When an extremely thin metal layer remains, the outlet of the aperture is a position that corresponds to the position of the aperture on, of the surfaces of the metal layer, the surface that is not the bottom surface of the aperture. This near-field light is influenced by the refractive index of material that contacts the metal film or periodic structure of the metal film, whereby the range of bleeding and intensity of the near-field light varies, but the near-field light appears even when a material such as a semiconductor exists on the outlet side. Near-field light localized in the vicinity of a minute aperture is believed to be absorbed within a semiconductor similar to ordinary propagated light to produce electron-hole pairs. The generation of electron-hole pairs based on this near-field light is carried out only in the localized near-field light region, and is added to the photocurrent that results from ordinary propagated light. Accordingly, if the electron-hole pair generation from this near-field light is greater than the electron-hole pair generation resulting from propagated light, the majority of the energy of incident light can generate a photocurrent in the extremely narrow near-field light region at a depth, of approximately 100 nm or less.

The inventors of the present invention have here fabricated a Schottky photodiode for detecting plasmon-enhanced near-field light and have investigated the photocurrent when the incident light has a wavelength of 830 nm. In the photodiode, a silver (Ag) film having a thickness of 200 nm and having aperture with a diameter of 300 nm is formed on the surface of a silicon (Si) substrate, the position of this aperture being the photodetection portion. Concentric grooves having a depth of 50 nm and a period of 560 nm are provided in the silver film around the aperture and the surface plasmon is excited by the irradiation of incident light onto the silver film, whereby surface plasmon resonance occurs. A chromium (Cr) layer of a thickness of 10 nm is further interposed at the interface between the silicon substrate and the silver film to realize close adherence of the substrate and the film. For the sake of comparison, a photodiode was also fabricated in which a concentric periodic structure was not provided on the silver film.

FIG. 3 shows the relation observed between the reverse bias current and the photocurrent of these photodiodes. In FIG, 3, dotted line A is the actually measured value of the photocurrent for the photodiode that lacks the concentric periodic structure on the silver film, and dotted line B shows the predicted value resulting from a calculation of the photocurrent in the photodiode having the concentric periodic structure on the silver film. The enhancement rate resulting from surface plasmon resonance is estimated for the intensity of transmitted light that has passed through the aperture, and the predicted value is then estimated based on this enhancement rate. The enhancement rate resulting from surface plasmon resonance was here estimated as approximately 20 times based on the data of the above-described paper of Tineke Thio et al. (Non-Patent Document 1) and with the diameter of the aperture as 36% of the wavelength of the incident light. Solid line C shows the actually measured value of photocurrent in the photodiode having a concentric periodic structure on the silver film.

As can be clearly seen from the results shown in FIG. 3, when an aperture having a diameter smaller than the wavelength is formed in a metal film, the actually measured value of the photocurrent for a case in which a concentric periodic structure in the metal film is present around the aperture is greater than the value estimated from the enhancement rate for the transmitted light. In particular, it was ascertained that when the reverse bias voltage is low, the photocurrent that flows is greater than the surface plasmon enhancement rate by a factor of 10. Based on the marked increase in photocurrent that exceeds expectations when the reverse bias voltage is low, this phenomenon becomes conspicuous when the depletion layer formed at the interface between the silver film and semiconductor layer is thin and is believed to result from the photon field that concentrates in the vicinity of this type of interface. In other words, the cause of this large photocurrent is believed to be the influence of the near-field light that was not estimated by Tineke Thio et al. Based on experimentation the inventors of the present invention have discovered that when a minute aperture is used, the contribution of near-field light surpasses the contribution of transmitted light to an extent that exceeds all expectations.

Conventionally, it wad believed that the optical absorption coefficient of semiconductor material in which electron-hole pairs are generated due to photons is relatively low, and therefore that electron-hole pairs could not be formed in sufficient numbers within the region in which near-field light is generated. In contrast, based on the results of experimentation by the inventors of the present invention, as shown in FIG. 3, it has been found that using near-field light that has been plasmon-enhanced in the vicinity of a minute aperture enables the production of an extremely small photodiode having sufficiently high photoelectric conversion efficiency.

In other words, adjusting the shape of a metal film on the semiconductor substrate and the carrier concentration in the semiconductor substrate such that the region of near-field light and the region of the depletion layer overlap enables the sufficient generation of electron-hole pairs by photons in the extremely narrow area of the degree of spread of the near-field light. In this case, the area of the depletion layer or the area of the junction may be on the order of the spread of near-field light, and in addition, the thickness of the depletion layer may be on the order of the bleeding of the near-field light, and as a result, the area and thickness of the depletion layer can be made far smaller than a photodiode of the prior art while maintaining high quantum efficiency. A photodiode can therefore be obtained that simultaneously realizes high quantum efficiency, high-speed response, and reduced dark current.

In the ordinary configuration of a photodetection circuit using a photodiode, the product of the load resistance connected to the photodiode for detecting signal voltage and the electrical capacitance of the junction portion in the photodiode is substantially the time constant of the circuit, as shown in FIG. 1 or FIG. 2. The photodiode of the present invention enables a dramatic reduction of the electrical capacitance by reducing the area of the junction, and to this extent, enables a reduction of the time constant of the circuit to realize high-speed operation.

When n-type silicon is used as the semiconductor, the length of the depletion layer is approximately 100 nm if the concentration of impurities is set to $10^{17}$ cm$^{-3}$, and the length of the depletion layer is 300 nm or more if the concentration of impurities is set to $5\times10^{15}$ cm$^{-3}$. Since the relative permittivity (dielectric constant) of silicon is approximately 12, setting the spacing of the pair of electrodes that sandwich the Schottky junction to no more than the length of the depletion layer, i.e., 100 nm, results in a junction capacitance of 0.1 fF for a case in which a round Schottky junction with a diameter of 300 nm is provided. Even if the parasitic capacitance accompanying the wiring pattern is assumed to be approximately 100 times the junction capacitance, the RC time constant of the photodiode circuit is approximately 0.5 ps when the load resistance is 50 Ω, from which a high-speed response of 300 GHz or more can be expected.

On the other hand, the response frequency that is found from the carrier transit time for passing through a depletion layer of 100 nm when using highest drift speed of $10^7$ cm/s that can be expected in silicon is approximately 160 GHz.

As can be seen from the above-described estimation, a circuit that uses the photodiode of the present invention is capable of extremely high speed response of 100 GHz or more even when using silicon, which has a relatively low absorption coefficient of light. In addition, if the same time constant as a circuit that uses the photodiode of the prior art is acceptable, a load resistance that is increased to the extent of the reduction of the junction capacitance is possible, and a higher signal voltage can therefore be obtained. Still further, the small volume of the depletion layer in the photodiode of the present invention decreases the incidence of noise that results from dark current.

The frequency range of light that can be detected using the photodiode of the present invention is the region in which the energy of photons is lower than the energy gap of the semiconductor, and moreover, equal to or greater than the plasma frequency of free electrons in the metal film. By selecting the materials used for the semiconductor and metal film, the shape of the surface periodic structure, and the diameter of the aperture of the metal film, the photodiode of the present invention can be used in the detection of light of the entire electromagnetic wave region including visible light, near infrared light, and far infrared light.

Effect of the Invention

As should be clear from the foregoing explanation, the present invention can obtain a photodiode in which the junction electrical capacitance is extremely small, and through the use of this photodiode, a photoelectric conversion circuit having high-speed response can be produced. In addition, the ability to connect a greater load resistance in a series to the photodiode allows a signal output voltage to be obtained that is higher than that of the prior art. The ability to obtain a high signal output voltage in turn enables a reduction of the amplification rate of the amplifier that is provided in stages that follow the photoelectric conversion circuit or even allows the elimination of an amplifier altogether, which not only allows the configuration of the photoelectric conversion circuit to be simplified to reduce fabrication costs but also allows the realization of a photoelectric conversion circuit having low power consumption.

Figure 1:
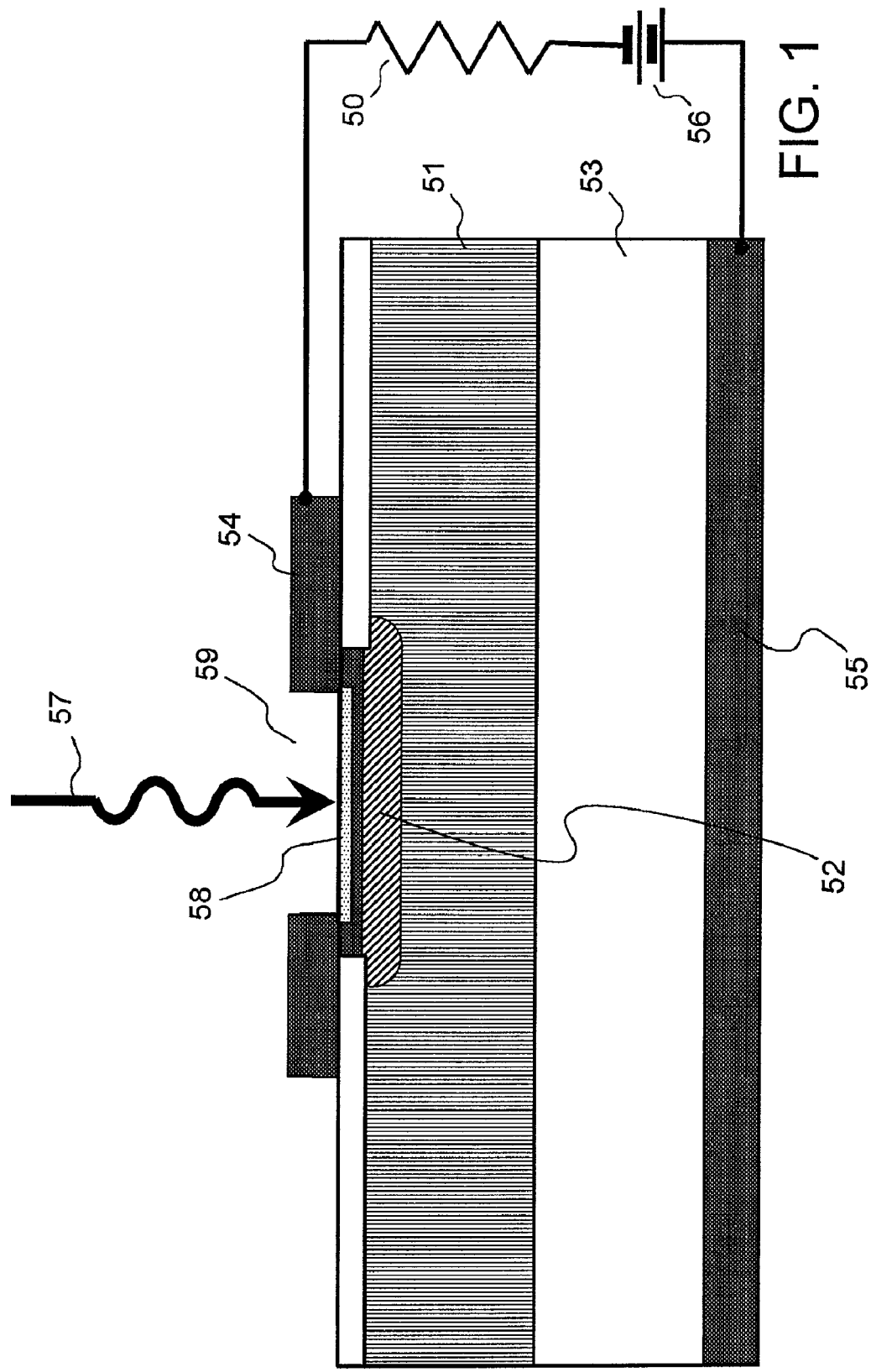
FIG. 1 is a sectional view showing an example of the configuration of a pin-type photodiode of the prior art.

EXPLANATION OF REFERENCE NUMERALS 1, 16, 24 substrate
2, 14, 25, 60 $n^+$-type semiconductor layer
3, 15, 26, 61 $n^-$-type semiconductor layer
4, 17 metal periodic structure member
5, 19, 29, 54, 62 first electrode
8, 20, 31, 55, 63 second electrode
6, 18, 27 aperture
7, 30 insulating layer
9, 21, 32, 56, 64 bias power supply
10, 22, 33, 50, 65; load resistance
11, 23, 57, 67 incident light
12 slit
13 antireflection film
28 metal structure member
40 scattering member
51 i-layer
52 p-layer
53 n-layer
59, 69 window
66 semi-transparent metal film

BEST MODE FOR CARRYING OUT THE INVENTION

First Embodiment

Figure 4:
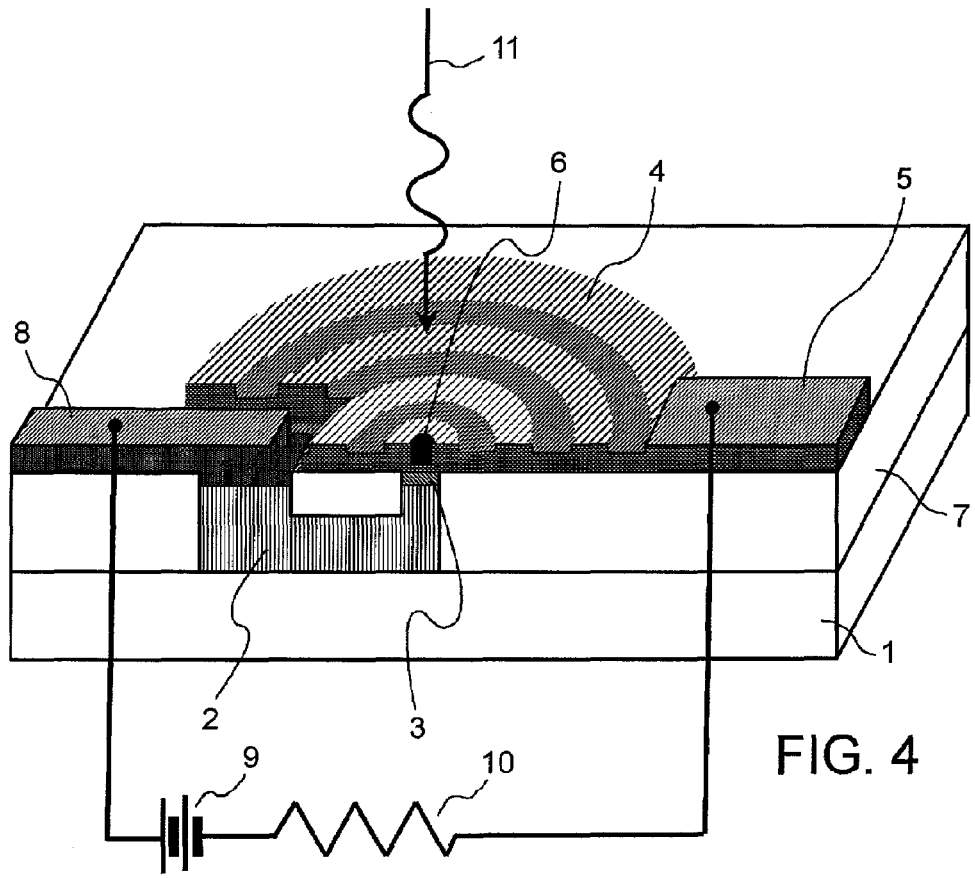
FIG. 4 is a partial sectional perspective view showing the configuration of a Schottky photodiode according to a first embodiment of the present invention.
Figure 5:
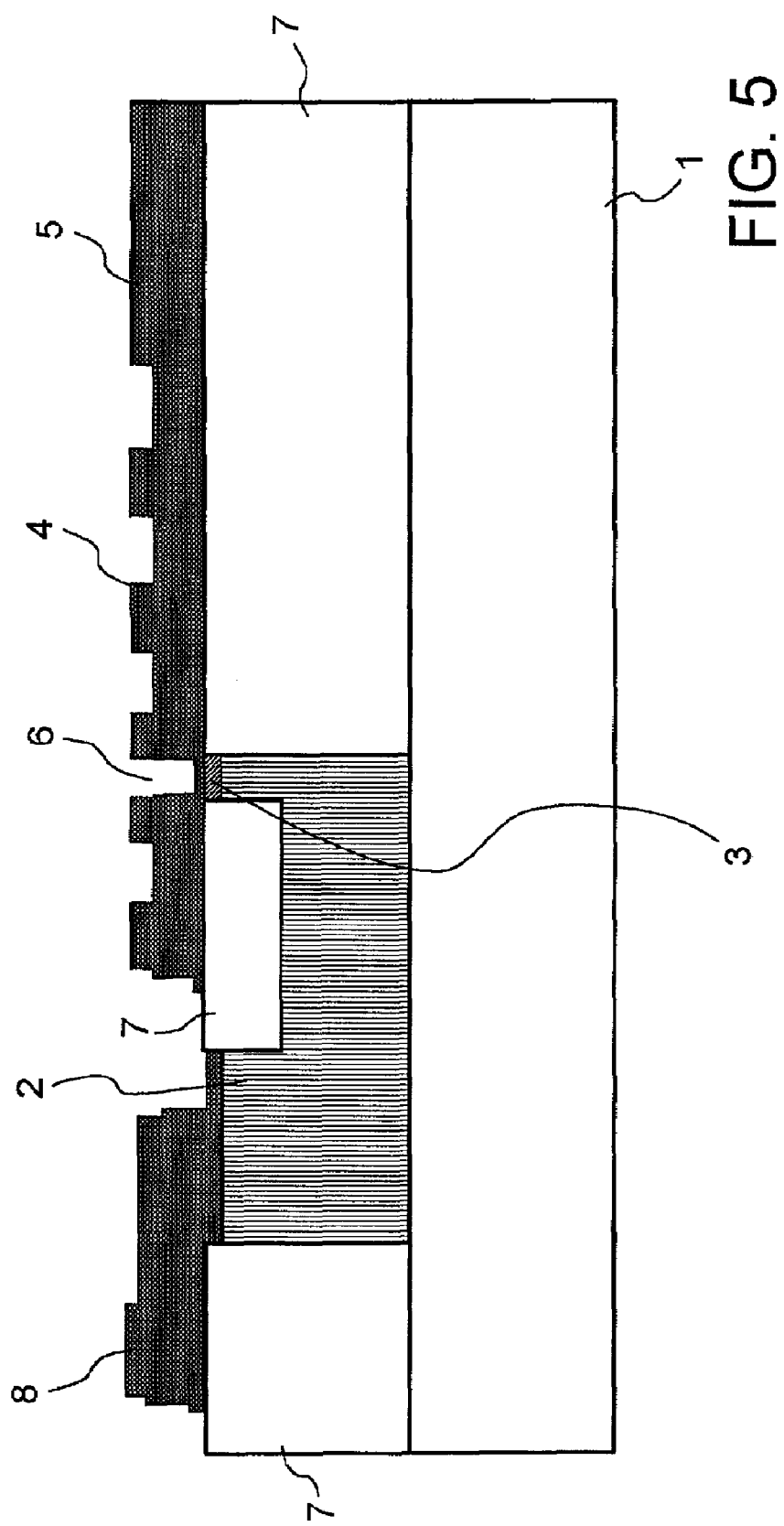
FIG. 5 is an enlarged sectional view showing the configuration of the Schottky photodiode of the first embodiment.

Explanation next regards a Schottky photodiode according to a first embodiment of the present invention. The Schottky photodiode of the first embodiment is configured as a planar photodiode. FIG. 4 is a partial sectional perspective view showing the overall configuration of this photodiode, and FIG. 5 shows an enlargement of this sectional view.

The Schottky photodiode shown in the figures is provided with: $n^+$-type semiconductor layer 2 formed on a portion of substrate 1 such as SOI (Silicon-On-Insulator) in which the surface is insulating; $n^-$-type semiconductor layer 3 provided on a portion of $n^+$-type semiconductor layer 2; metal periodic structure member 4 that contacts $n^-$-type semiconductor layer 3 and that has electrical conductivity; first electrode (anode electrode) 5 connected to metal periodic structure member 4; second electrode (cathode electrode) 8 that confronts first electrode 5 and contacts $n^+$-type semiconductor layer 2; bias power supply 9 for applying a reverse bias voltage across first and second electrodes 5 and 8; and load resistance 10 inserted between bias power supply 9 and first electrode 5.

Aperture 6 is provided in metal periodic structure member 4. As will be later explained, aperture 6 does not fully penetrate metal periodic structure member 4. Metal periodic structure member 4 contacts $n^-$-type semiconductor layer 3 only at aperture 6 and positions in the vicinity of aperture 6, and further, $n^-$-type semiconductor layer 3 is formed on $n^+$-type semiconductor layer 2 only at aperture 6 and the positions in the vicinity of aperture 6. In other locations, insulating layer 7 is provided between metal periodic structure member 4 and $n^+$-type semiconductor layer 2 or substrate 1. First electrode 5 is provided on insulating layer 7 and connects to metal periodic structure member 4. Second electrode 8 is also provided on insulating layer 7. A portion of $n^+$-type semiconductor layer 2 penetrates insulating layer 7 and appears at the upper surface of insulating layer 7, and $n^+$-type semiconductor layer 2 is joined to second electrode 8 in this location.

In this configuration, incident light 11 is incident to metal periodic structure member 4 which is formed as a metal film through which light substantially does not pass. Incident light 11 excites the surface plasmon in metal periodic structure member 4 and couples with this surface plasmon to produce a resonant state with the surface plasmon by means of the periodic structure. The generation of this resonant state generates strong near-field light in the vicinity of the semiconductor surface on the opposite surface of the light-incident surface of aperture 6 that is located in the center of metal periodic structure member 4. This near-field light generates electron-hole pairs in the depletion layer that accompanies the Schottky barrier on the semiconductor side of the vicinity of aperture 6 and thus generates photovoltaic energy. The intensity of incident light 11 is converted to the voltage difference over the both ends of load resistance 10.

As described in the foregoing explanation, the semiconductor portion below metal periodic structure member 4 is made up from substrate 1, $n^+$-type semiconductor layer 2 having high electric conductivity, and $n^-$-type semiconductor layer 3 that is formed on a portion of $n^+$-type semiconductor layer 2. $N^+$-type semiconductor layer 2 is obtained by implanting impurity ions at a concentration of at least $1 \times 10^{20}$ cm$^{-3}$ into silicon. $N^-$-type semiconductor layer 2 can be formed by epitaxial growth of semiconductor crystal containing impurity ions on the order of $1 \times 10^{17}$ cm$^{-3}$ on $n^+$-type semiconductor layer 2. A more specific explanation regarding the fabrication processes will be given later.

Metal periodic structure member 4 is formed from a material such as silver (Ag) or gold (Au) having little plasmon loss. Aperture 6 is provided in the central portion of metal periodic structure member 4, and a periodic structure composed of concentric surface irregularities is formed in metal periodic structure member 4 with this aperture as a center. The period of the surface irregularities of metal periodic structure member 4 is the resonance wavelength of the surface plasmon and is set to a value slightly shorter than the period of the incident light, i.e., the signal light. For example, in the case of light wavelength of 800 nm, the period of the surface irregularity is on the order of 600 nm. The effect of surface plasmon resonance is exhibited when the depth of the surface irregularity is set to a value on the order of 20 to 200 nm. The film thickness of metal periodic structure member 4 is preferably set to at least 100 nm such that virtually no light is transmitted even at depressions where the film thickness is a minimum, and because excessive film thickness weakens the near-field light in the vicinity of aperture 6, the film thickness must be no greater than 1000 nm. First electrode 5 is connected to metal periodic structure member 4 over insulating layer 7 and may be formed at the same time as metal periodic structure member 4 using the same material as metal periodic structure member 4.

Figure 2:
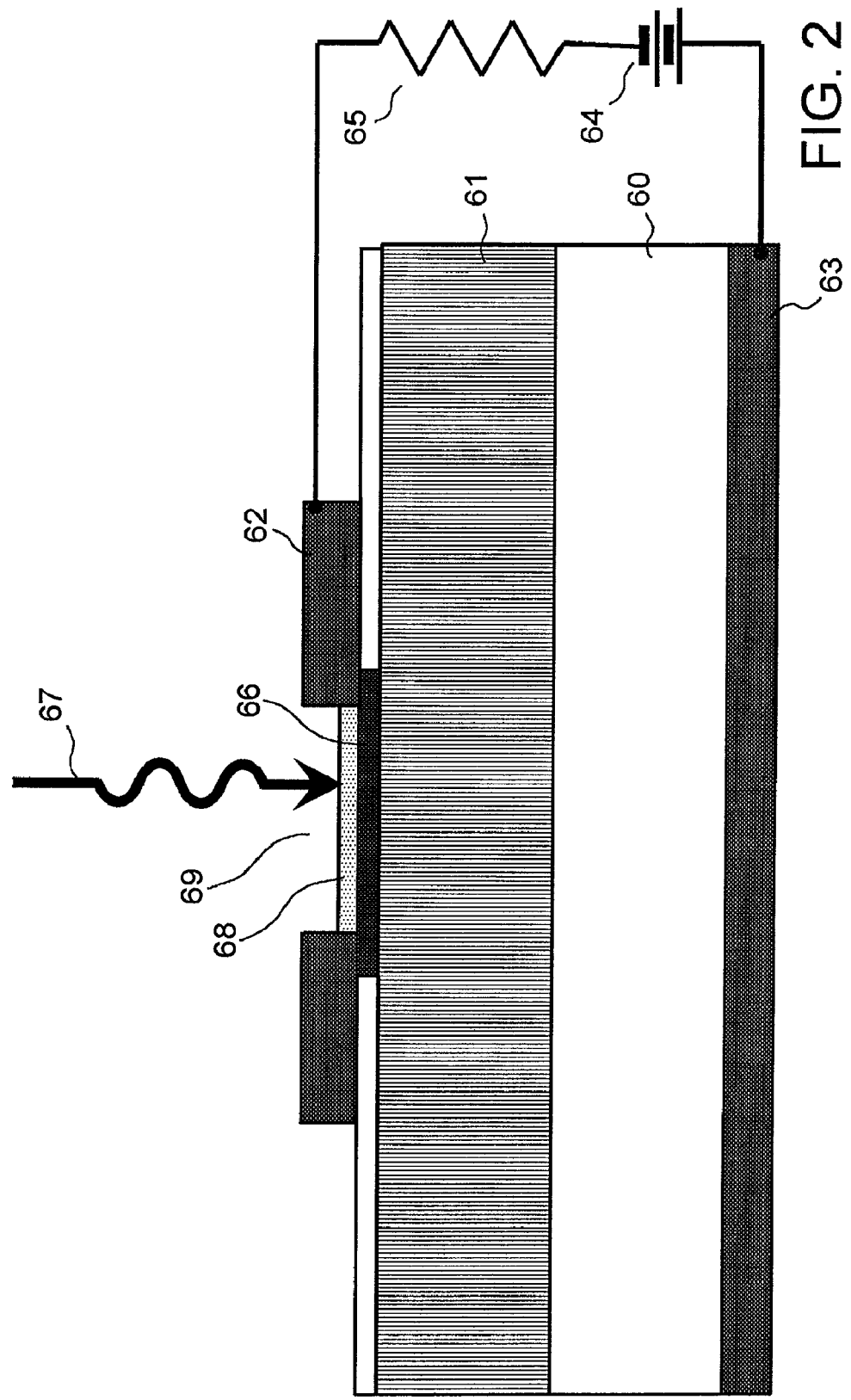
FIG. 2 is a sectional view showing an example of the configuration of a Schottky photodiode of the prior art.
Figure 3:
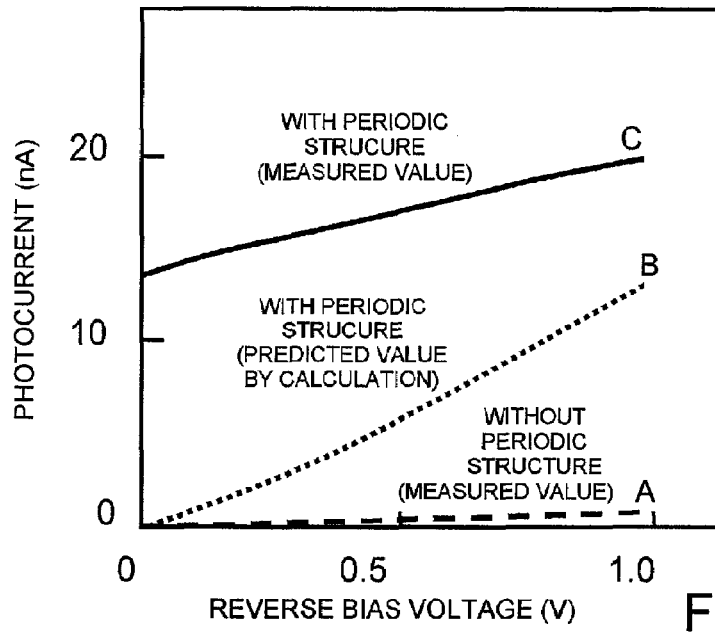
FIG. 3 is a graph showing the relation between reverse bias voltage and photocurrent in a photodiode configured to detect near-field light that has been enhanced by surface plasmon resonance.

The shape of the surface irregularity on metal periodic structure member 4 is not limited to the rectangular profile shown in FIG. 2 and may also assume a shape in which the apices of the ridges have a triangular profile, the side surfaces have a curved surface, or the corners are rounded. Even with these shapes, the same effect produced by surface plasmon resonance is seen. In addition, the ratio of the length of the depressions and the length of the ridges can be any value. The effect can be seen to some degree even when only one period of concentric irregularity is provided, i.e., when only a single circular structure is formed surrounding aperture 6. However, a greater surface plasmon resonance effect can be obtained by providing three or more periods, i.e., triple or higher concentric circular structure. Incident light 11 is irradiated onto a portion of, or over all of metal periodic structure member 4.

The area over which n⁻-type semiconductor layer 3 contacts metal periodic structure 4 is set to substantially overlap the region of aperture 6. The region of generation of the near-field light that appears in the vicinity of the minute aperture usually spreads somewhat beyond the diameter of aperture 6. As a result, the junction area between metal periodic structure member 4 and n⁻-type semiconductor layer is normally set larger than the diameter of aperture 6 by the lithography positioning error, i.e., on the order of 10 nm to 500 nm on each side. In contrast, operation as a photodiode is possible even if aperture 6 is formed protruding beyond the junction area such that a portion of the near-field light appears outside n⁻-type semiconductor layer 3.

Aperture 6 does not completely penetrate metal periodic structure member 4, and a metal layer having a thickness of approximately 10 nm or less remains at the bottom of aperture 6. This metal layer is composed of a material having little surface plasmon loss such as silver or gold, which is the material that forms metal periodic structure member 4, or is an adhesion layer such as chromium (Cr), or is a laminated structure of both materials. Alternatively, this metal layer may also be an incomplete film in which holes such as pinholes have been formed in portions. A Schottky barrier occurs along the interface between metal periodic structure member 4 and n⁻-type semiconductor layer 3. The propagation distance of near-field light is 100 nm or less, and the region of greatest intensity is localized at a position at a depth of approximately 10 nm in n⁻-type semiconductor layer 3. The calculated width of the depletion layer brought about by the Schottky barrier is on the order of 100 nm in the case of silicon in which the donor impurity concentration is $1 \times 10^{17}$ cm$^{-3}$, and therefore the thickness of the n⁻-type semiconductor layer 3 can be reduced to 50 nm or less by further increasing the donor impurity concentration.

N⁺-type semiconductor layer 2 has a doping concentration of impurity as high as $1 \times 10^{20}$ cm$^{-3}$ or more and makes ohmic contact with the second electrode. However, even when the doping concentration in n⁺-type semiconductor layer 2 is slightly lower than $1 \times 10^{20}$ cm$^{-3}$, photodiode operation can be obtained that is similar to that of the above-described configuration if the Schottky barrier height that is formed between n⁺-type semiconductor layer 2 and the second electrode is relatively lower than the Schottky barrier between metal periodic structure member 4 and n⁻-type semiconductor layer 3

First electrode 5 and second electrode 8 are connected to load resistance 10 by way of bias power supply 9, whereby the intensity of incident light 11 is converted to the difference in potential across the both ends of load resistance 10 in this circuit configuration.

Figure 6:
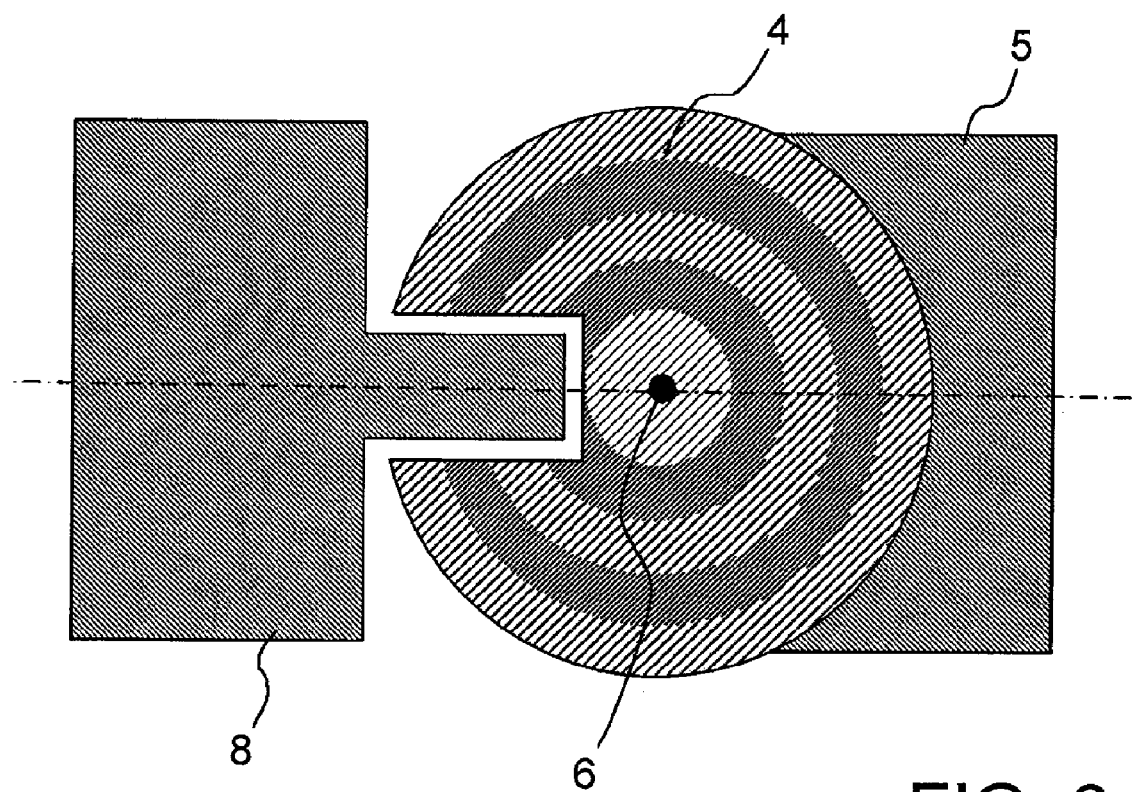
FIG. 6 is a plan view showing an example of the electrode arrangement of the Schottky photodiode of the first embodiment.

FIG. 6 shows an example of the positional relations of metal periodic structure member 4, first electrode 5, and second electrode 8 on insulating layer 7. In the example shown here, first electrode 5 and second electrode 8 exist on the same plane, and second electrode 8 is arranged in a shape that intrudes into an area notched into a portion of the concentric surface irregularities of metal periodic structure member 4. However, first electrode 5 and second electrode 8 need not be formed on the same plane. In addition, because second electrode 8 need not bring about plasmon enhancement, second electrode 8 does not require the use of the same material such as gold or silver as first electrode 5 and can use, for example, copper (Cu), nickel (Ni), tungsten (W), or aluminum (Al).

When the shape of aperture 6 is a circle, the conspicuous enhancement of near-field light brought about by the surface plasmon occurs when the diameter of aperture 6 is within a range from one-half to 1/10 the wavelength of incident light. This is because the greater part of the photon energy is transmitted through aperture 6 as propagated light and the energy therefore cannot be confined as near-field light when aperture 6 is on the same order as the wavelength or larger than the wavelength. On the other hand, when the diameter of aperture 6 is smaller than 1/10 the wavelength of the incident light, there is little propagation of energy to the opposite side of aperture 6 despite the use of plasmon enhancement, and the greater part of the photon energy is reflected. Accordingly, the diameter of the aperture is preferably on the order of 80 nm to 400 nm when using incident light having a wavelength of 800 nm. In addition to a circle, aperture 6 can also take the form of a rectangle, hexagon, or an oval.

As described in the foregoing explanation, metal periodic structure member 4 contacts n⁻-type semiconductor layer 3 only in the vicinity of aperture 6, and in other locations, insulating layer 7 is present between metal periodic structure member 4 and each semiconductor layer. This is because the depletion layer existing in the range not reached by light makes no contribution to photovoltaic energy and contributes only to dark current. A material used in ordinary semiconductor processes such as $SiO_2$ may be used as insulating layer 7. In addition, when metal periodic structure member 4 and n⁻-type semiconductor layer 3 form unwanted parasitic capacitance outside the depletion layer and increase the overall electrical capacitance, the response speed of the circuit is delayed. Thus, insulating layer 7 must be set to the greatest possible thickness in order to reduce the dark current and increase the response speed. Insulating layer 7 is preferably set to a thickness of at least 500 nm, whereby a reduction of the parasitic capacitance to a value of 1 fF or less can be expected. An insulating film having a low dielectric constant such as SiOF or SiOC obtained by doping $SiO_2$ with fluorine (F) or carbon (C) can also be used as the material of insulating layer 7, these materials being effective for reducing parasitic capacitance.

<<Fabrication Method>>

Explanation next regards a method of fabricating the above-described photodiode when silicon is used as the semiconductor material. FIGS. 7A to 7J show the progression of the fabrication method of the photodiode of the first embodiment.

Figure 7A:
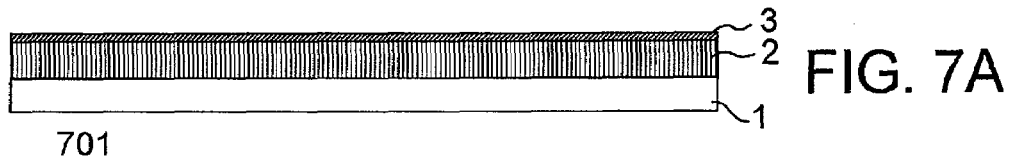
FIGS. 7A to 7J show the progression of fabrication processes of the Schottky photodiode of the first embodiment.

First, as shown in FIG. 7A, a substrate is prepared in which n⁺-type semiconductor layer 2 is formed over the entire surface of one principle surface of substrate layer 1 composed of, for example, $SiO_2$, and n⁻-type semiconductor layer 3 is formed over the entire surface of n⁺-type semiconductor layer 2. N⁺-type semiconductor layer 2 is obtained by implanting phosphorus (P) ions into a silicon layer at a concentration of at least $1 \times 10^{20}$ cm$^{-3}$ to achieve electrical resistivity on the order of $10^{-4}$ Ω·cm. N⁻-type semiconductor layer 3 is obtained by depositing an n-type silicon that contains phosphorus on the order of $1\times10^{17}$ cm$^{-3}$ on n$^+$-type semiconductor layer 2 by a chemical vapor method to a thickness of approximately 100 nm.

Figure 7B:
Figure 7C:

Next, as shown in FIG. 7B, mask 701 is formed on n$^-$-type semiconductor layer 3 aligned with the area in which n$^+$-type semiconductor layer 2 is to be formed in the completed photodiode. Mask 701 is obtained by providing a photoresist of a desired shape on silicon nitride having a thickness of 100 nm to 150 nm deposited by, for example, a chemical vapor method or the like, and then subjecting the silicon nitride to ion etching or the like. Next, as shown in FIG. 7C, mask 701 is used to etch n$^-$-type semiconductor layer 3 and n$^+$-type semiconductor layer 2. At this time, in areas in which mask 701 is not provided, n$^-$-type semiconductor layer 3 should be entirely removed and the greater part of n$^+$-type semiconductor layer 2 should be remove to reduce the thickness thereof. Chemical dry etching, which is well known in semiconductor fabrication processing, is used as the etching method, and CF$_4$ or a gas mixture of CF$_4$ and O$_2$ is used as the reactive gas.

Figure 7D:
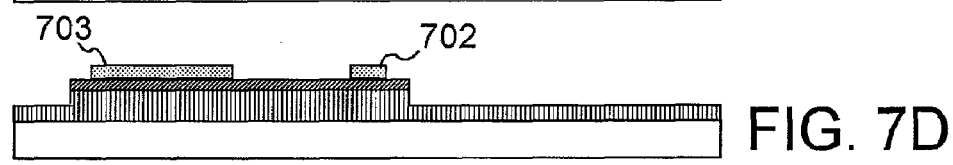
Figure 7E:
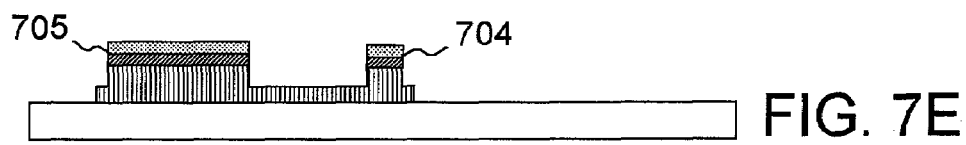

Next, as shown in FIG. 7D, mask 701 is further patterned to produce mask 702 of approximately 1 μm diameter for Schottky connection corresponding to aperture 6 and mask 703 that is larger than mask 702 for ohmic connection of n$^+$-type semiconductor layer 2. Masks 702 and 703 are formed by ion etching or the like. Masks 701 and 702 are next used, as shown in FIG. 7E, in the etching of n$^-$-type semiconductor layer 3 and n$^+$-type semiconductor layer 2 to form mesa 704 for Schottky connection and mesa 705 for ohmic connection, whereby n$^+$-type semiconductor layer 2 and n$^-$-type semiconductor layer 3 attain the same shape as in the completed photodiode. In other words, n$^+$-type semiconductor layer 2 is entirely removed from areas other than the area of mesa 704 for Schottky connection, the area of mesa 705 for ohmic connection, and the area that joins the two mesas 704 and 705. Chemical dry etching, which is well known in semiconductor fabrication processing, is used as the etching method, and CF$_4$ or a gas mixture of CF$_4$ and O$_2$ is used as the reactive gas.

Figure 7F:
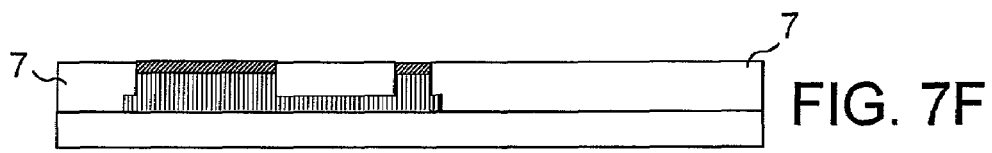

N$^-$-type semiconductor layer 3 and n$^+$-type semiconductor layer 2 are next embedded in insulating layer 7. Insulating layer 7 is composed of, for example, SiO$_2$, and is formed by bias CVD, which is a plasma chemical vapor method in which ions are drawn to the substrate side to bury the differences in levels. After the SiO$_2$ film has been grown, the substrate is placed in hot phosphoric acid at approximately 130° C. for about one hour to remove masks 702 and 703. FIG. 7F shows the substrate following the removal of masks 702 and 703. A substantially flat surface can be obtained by optimizing the mesa shape and oxidation processes, but a more even surface can be obtained by using a polishing technique such as mechano-chemical polishing (CMP).

Figure 7G:
Figure 7H:

Next, as shown in FIG. 7G, n$^-$-type semiconductor layer 3 on mesa 705 for ohmic connection is removed by means of, for example, chemical ion etching. Metal layer pattern 706 is next provided in the positions that are to become metal periodic structure member 4, first electrode 5, and second electrode 8 as shown in FIG. 7H. This metal layer pattern 706 is preferably composed of a material having low electrical resistivity. In addition, the film thickness of this metal layer pattern 706 is preferably no greater than 200 nm to keep the transmittance of the signal light at aperture 6 of metal periodic structure member 4 at a high level, and to prevent interference of the enhancement effect produced by the surface plasmon. When material such as silver which has poor adhesion to silicon is used for metal layer pattern 706, chromium, titanium, tantalum, tungsten, nickel or the like provided as an adhesion layer at a thickness of 10 nm or less and preferably 3 nm or less can be provided as a foundation layer for metal layer pattern 706. Metal layer pattern 706 is formed divided between a pattern for covering the entire Schottky connection mesa and a pattern for covering a portion of the ohmic connection mesa, the two patterns being electrically separated.

Figure 7I:
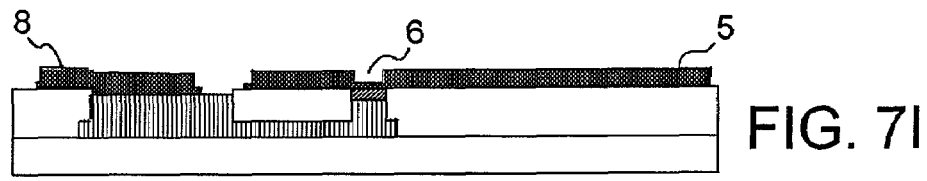

Aperture 6 is next formed in metal layer pattern 706 at a position in the central portion of mesa 704 for Schottky connection as shown in FIG. 7I. A film is further formed for metal periodic structure member 4, first electrode 5, and second electrode 8 on metal layer-pattern 706. At this time, a photoresist mask is provided in advance such that the metal film is not formed in areas other than the positions of formation of metal layer pattern 706. After forming the electrodes, the well-known lift-off method is implemented for removing the photoresist mask together with the unneeded metal, whereby metal periodic structure member 4, first electrode 5, and second electrode 8 are formed. A material such as silver or gold having low electrical resistance in the optical region and that limits surface plasmon loss is preferably used for the metal periodic structure member and the electrodes, but second electrode 8 need only be a conductor and does not require the use of silver or gold.

Figure 7J:
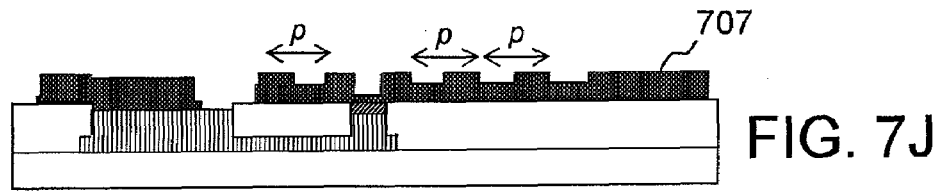

Next, as shown in FIG. 7J, periodic surface irregularities with pitch P is formed in the surface of metal periodic structure member 4 by, for example, additionally forming the same metal as the electrodes (silver or gold) as additional metal layer 707 by a lift-off method or the like.

The photodiode shown in FIGS. 4 to 6 is completed by the above-described processes.

In the first embodiment described above, another semiconductor of the IV group elements such as germanium or SiGe can be used in place of silicon as the semiconductor material for making up the photodiode. A III-V group compound semiconductor of GaAs or InP can also be used. The selection of these materials is determined based on the wavelength limits that are restricted by the band gaps and absorption coefficients of light. Superior photodiode characteristics are obtained at wavelengths in the vicinity of 800 nm to 900 nm when silicon is used, at wavelengths in the vicinity of 1300 nm to 1500 nm when germanium is used; and at wavelengths in the vicinity of 1300 nm to 1600 nm when InGaAs grown on InP is used. When germanium is used, a substrate such as a GOI (Germanium On Insulator) substrate that has been fabricated using an ultra-high vacuum chemical vapor deposition method, molecular beam epitaxial method or the like is used in place of an SOI substrate. When a III-V group compound semiconductor is used to form the photodiode, a semi-insulating substrate may be used in place of an insulating substrate, and an n$^+$-type III-V group compound semiconductor layer can be formed on the semi-insulating substrate. For example, an n$^+$-type GaAs layer is formed on a GaAs substrate, which is a semi-insulating semiconductor, following which an n$^-$-type GaAs layer is further formed on a portion of this surface. A metal periodic structure member made from silver is arranged in contact with this n$^-$-type GaAs layer.

Explanation next regards another example of the configuration of the photodiode of the above-described first embodiment.

Figure 8:
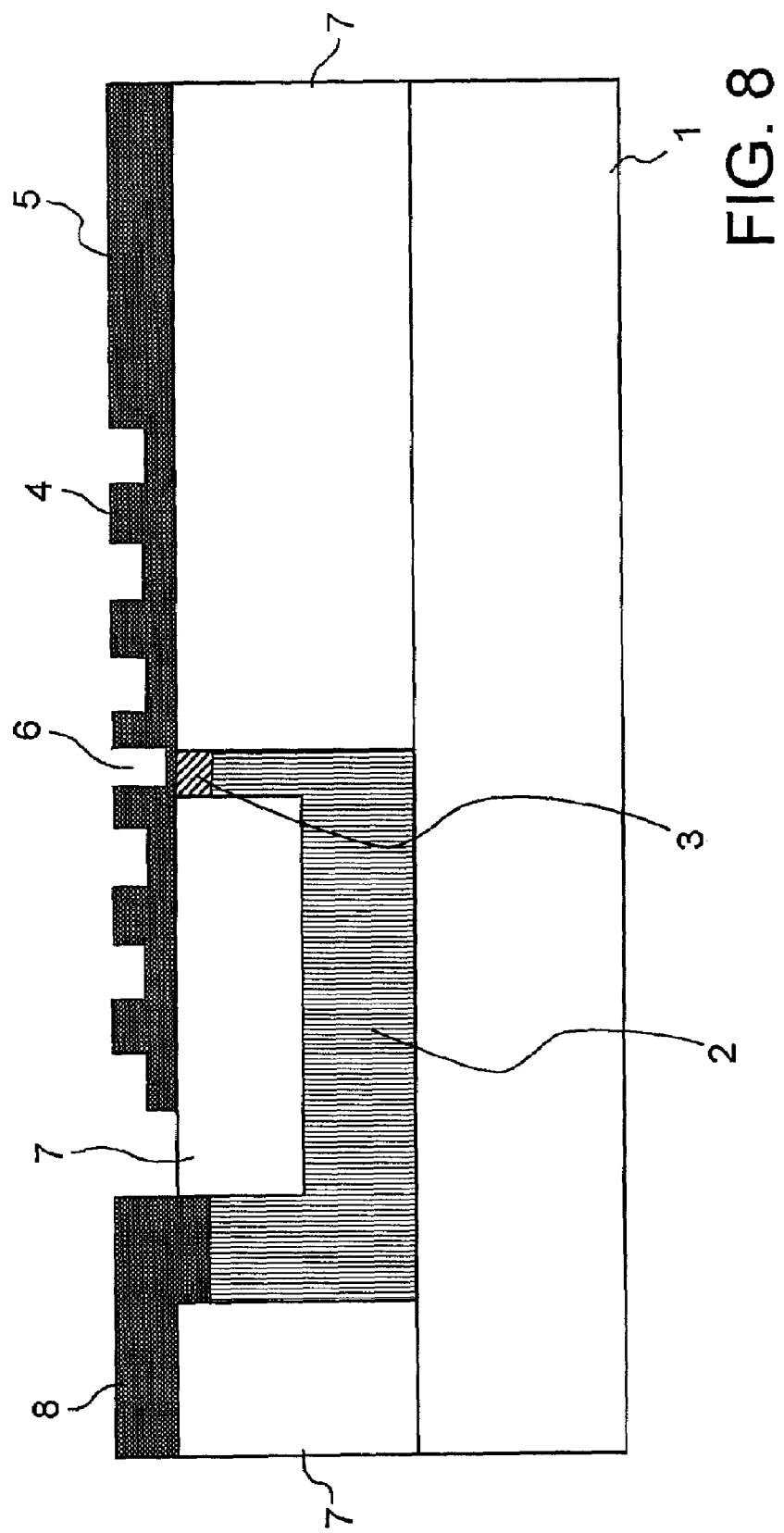
FIG. 8 is an enlarged sectional view showing a second example of the Schottky photodiode of the first embodiment.
Figure 9:
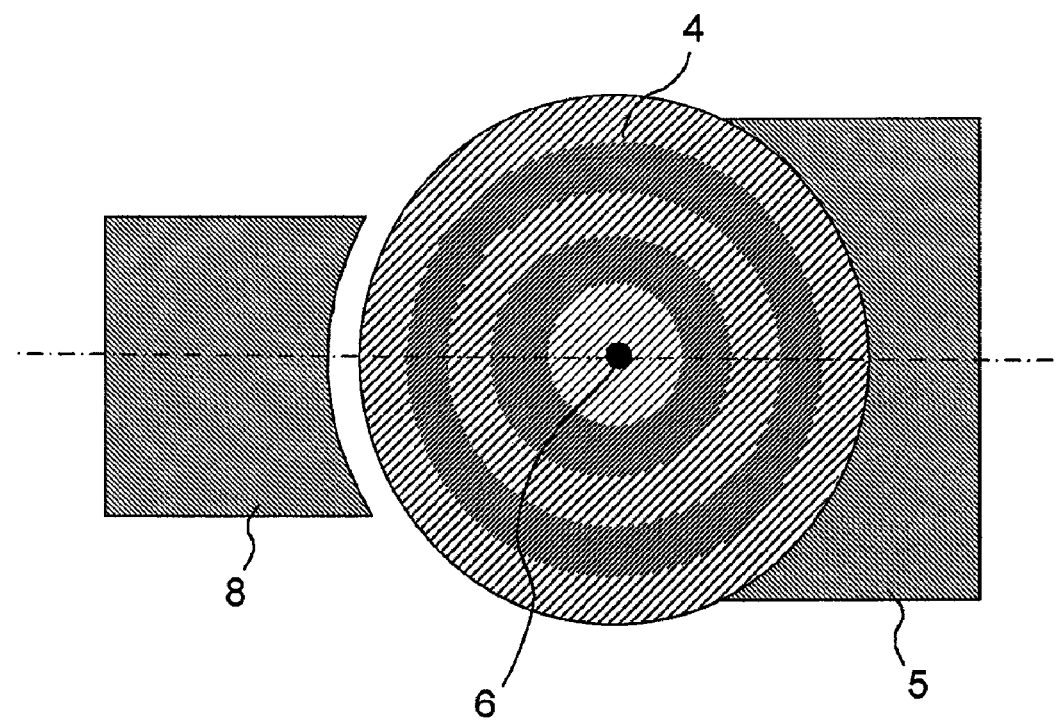
FIG. 9 is a plan view of the electrode arrangement shown in FIG. 8.

FIG. 8 and FIG. 9 show a second example of the Schottky photodiode of the first embodiment. This photodiode is similar to the photodiode shown in FIGS. 4 to 6, but differs from the photodiode shown in FIGS. 4 to 6 in that a partial notch portion for the encroaching provision of second electrode 8 is not provided in metal periodic structure member 4 that has concentric surface irregularities.

Figure 10:
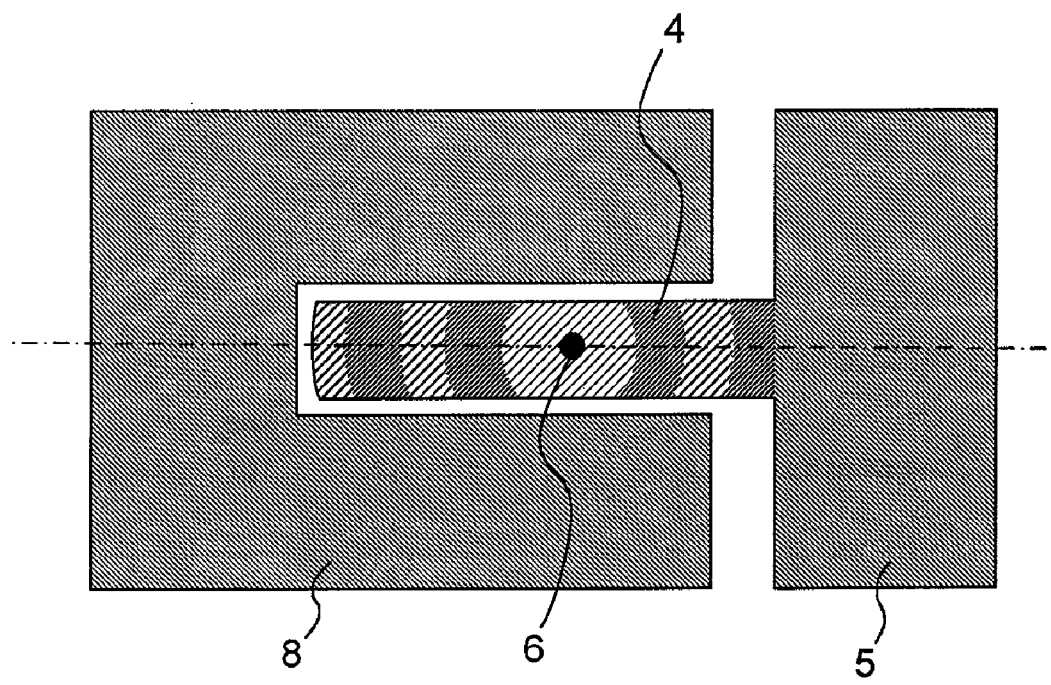
FIG. 10 is a plan view showing a third example of the Schottky photodiode of the first embodiment.

FIG. 10 shows a third example of the Schottky photodiode of the first embodiment. This photodiode is similar to the photodiode shown in FIGS. 4 to 6, but differs from the photodiode shown in FIGS. 4 to 6 in that metal periodic structure member 4 has a shape in which the metal periodic structure member in the photodiode shown in FIGS. 4 to 6 is cut into a strip form and second electrode 8 is formed along the three sides of metal periodic structure member 4 so as to surround this strip-shaped metal periodic structure member 4.

Figure 11:
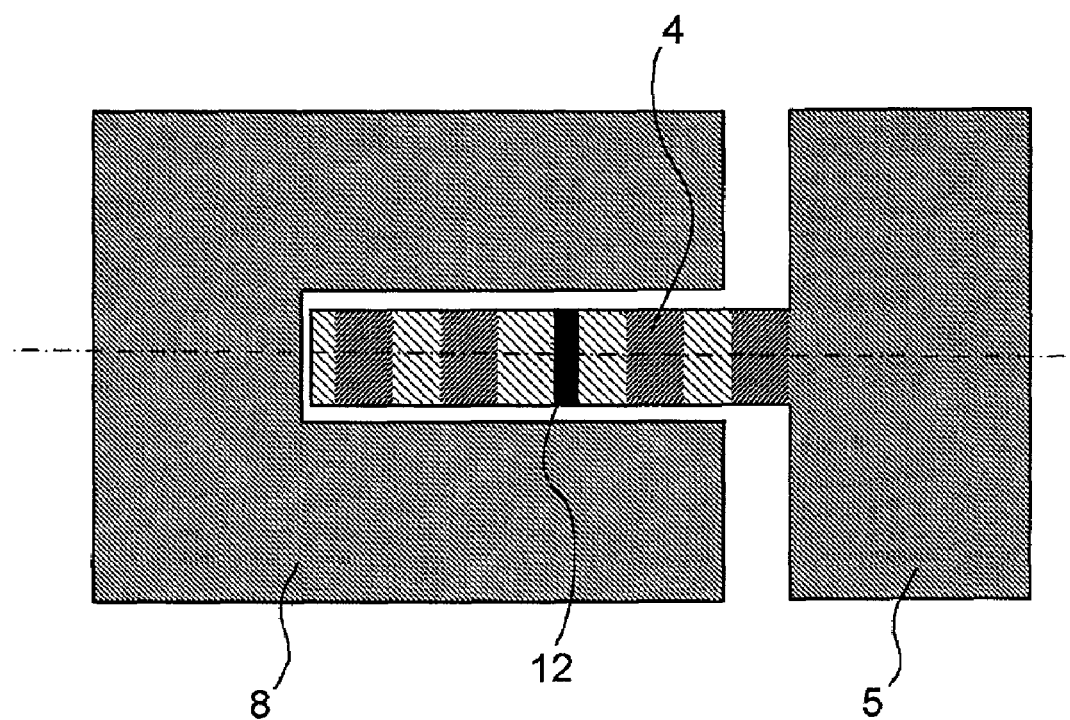
FIG. 11 is an enlarged sectional view showing a fourth example of the Schottky photodiode of the first embodiment.

FIG. 11 shows a fourth example of the Schottky photodiode of the first embodiment. This photodiode is similar to the photodiode shown in FIG. 10, but differs from the photodiode shown in FIG. 10 in that narrow slit 12 is formed in place of aperture 6, and the surface irregularities of the metal periodic structure member are not formed as concentric surface irregularities but as parallel grooves. The gap of slit 12 is preferably one half or less the wavelength of incident light, and the longitudinal length of slit 12 is preferably no greater than the wavelength of the incident light.

Figure 12:
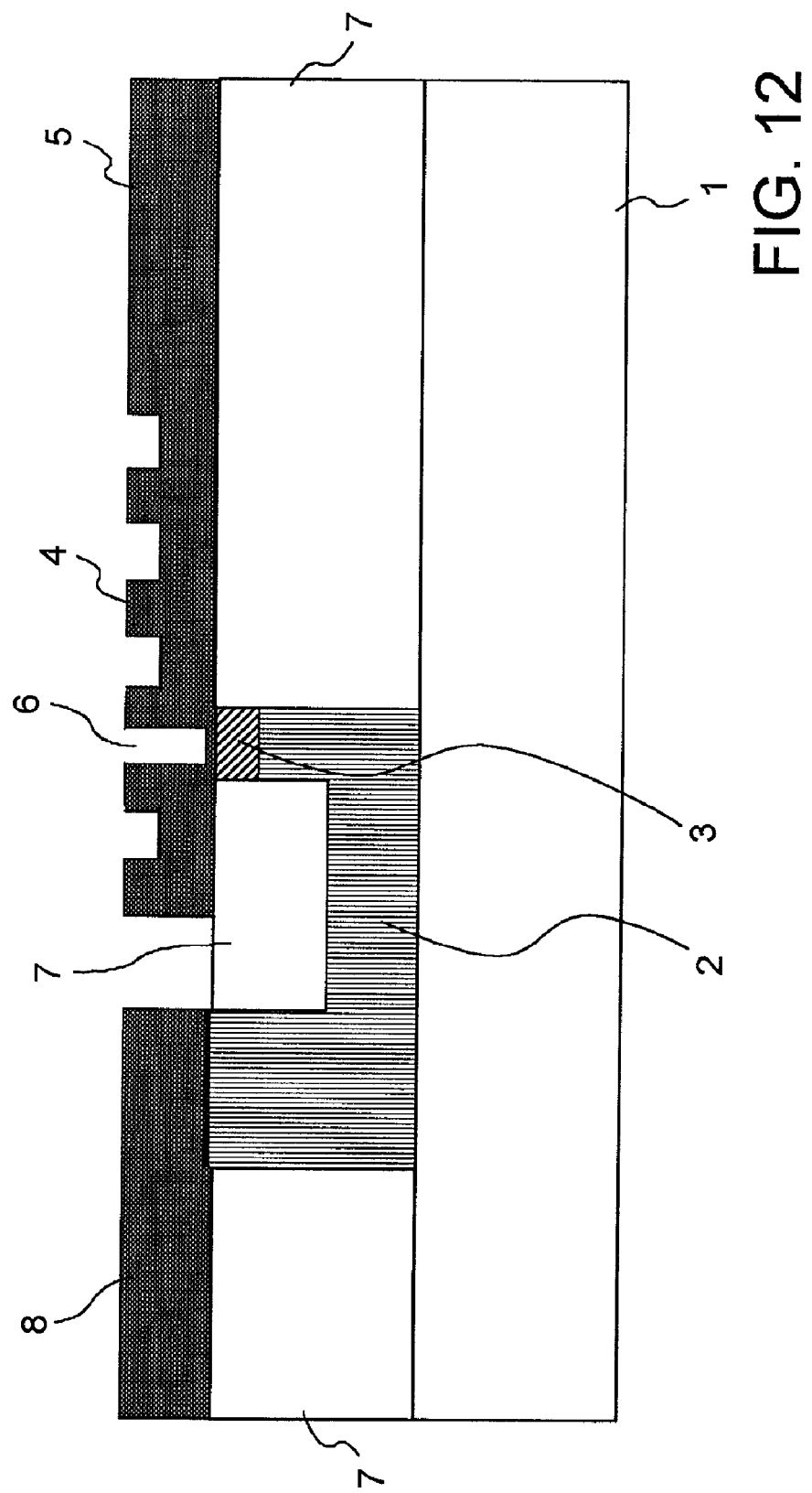
FIG. 12 is an enlarged sectional view showing a fifth example of the Schottky photodiode of the first embodiment.

FIG. 12 shows a fifth example of the Schottky photodiode of the first embodiment. This photodiode has substantially the same construction as the photodiode shown in FIGS. 4 to 6, but differs in that the interface at which metal periodic structure member 4 contacts $n^-$-type semiconductor layer 3 and the interface at which metal periodic structure member 4 contacts insulating layer 7 are on substantially the same plane. Here, "substantially the same plane" means that the difference in levels between the two interfaces is sufficiently small with respect to the wavelength of light, and more specifically, a dimension of 1/30 the wavelength or less. A photodiode having this construction can be fabricated by, when forming the mesa for Schottky connection and the mesa for ohmic connection, using different masks for the position on $n^+$-type semiconductor layer 2 that contacts the first electrode and the position that contacts the second electrode to deposit $n^-$-type semiconductor layer and $n^+$-type semiconductor layer, respectively, by molecular beam epitaxy or ultra-high vacuum chemical vapor method. This construction has the advantage of facilitating the simultaneous formation of metal periodic structure member 4, first electrode 5, and second electrode 8.

Figure 13:
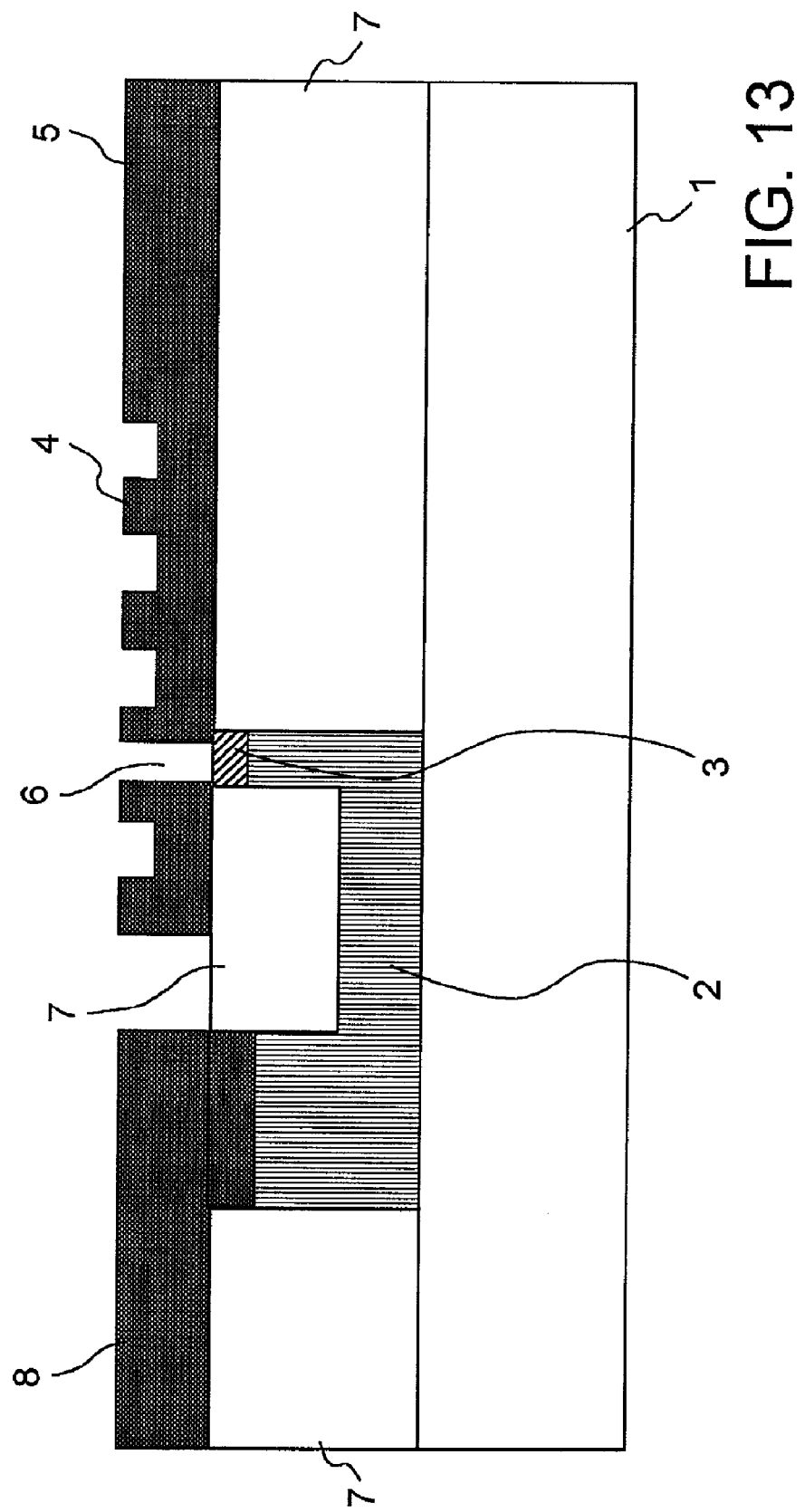
FIG. 13 is an enlarged sectional view showing a sixth example of the Schottky photodiode of the first embodiment.

FIG. 13 shows a sixth example of the Schottky photodiode of the first embodiment. In this photodiode, in contrast to the photodiodes each of the above-described examples, aperture 6 that is provided on metal periodic structure member 4 completely penetrates, whereby $n^-$-type semiconductor layer 3 below aperture 6 is exposed and metal periodic structure member 4 contacts $n^-$-type semiconductor layer 3 at the periphery of the aperture. If the diameter of aperture 6 is no greater than one-half the wavelength of the incident light, the amount of light transmitted by aperture 6 is extremely small and nearly all photons that appear on the opposite of aperture 6 will be in the form of near-field light. Accordingly, a photodiode can be obtained that operates similar to a case in which a metal layer exists at the bottom of aperture 6.

Figure 14:
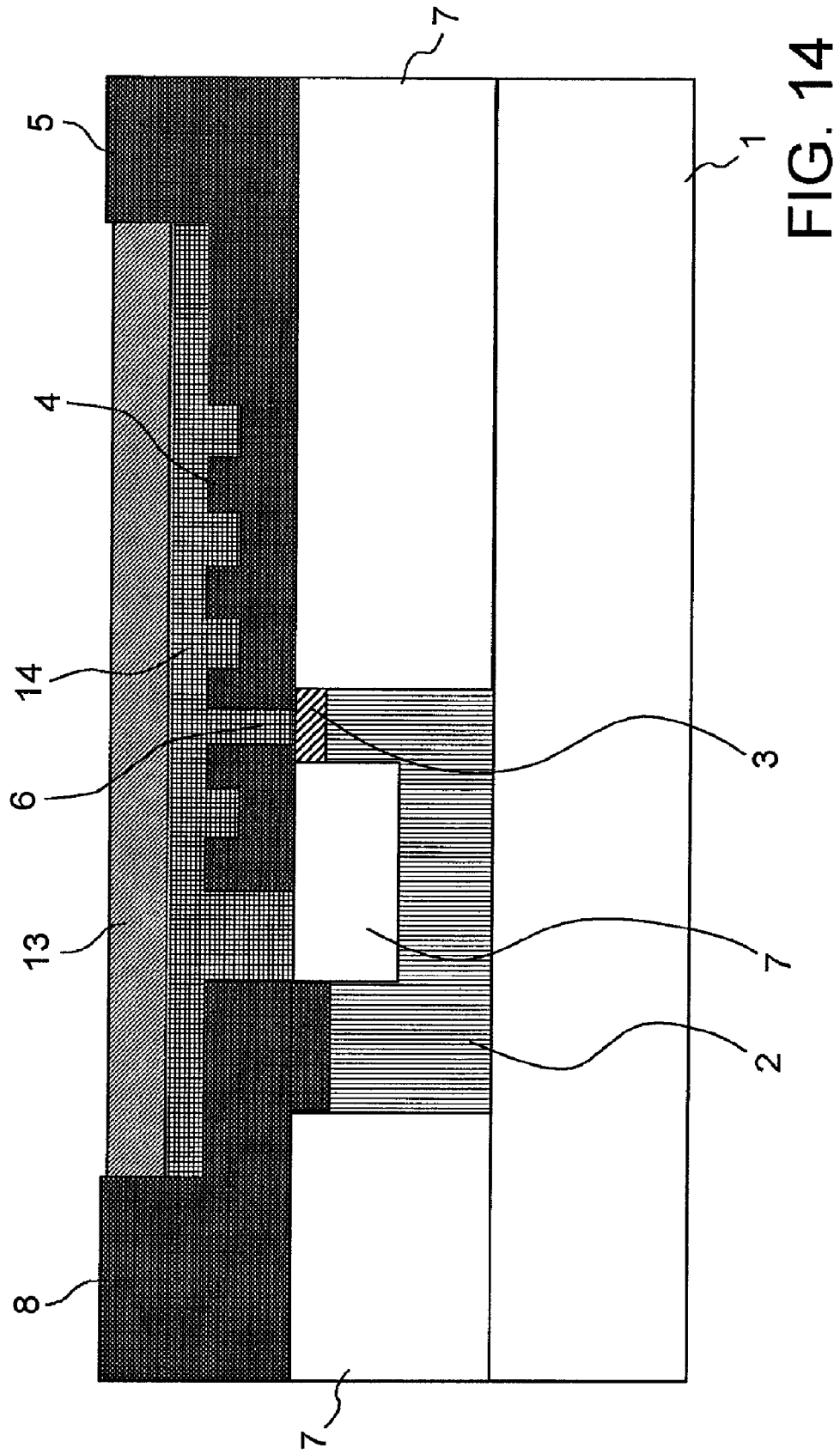
FIG. 14 is an enlarged sectional view showing a seventh example of a planar Schottky photodiode of the first embodiment.

FIG. 14 shows a seventh example of the Schottky photodiode of the first embodiment. This photodiode is similar to the photodiode shown in FIG. 13 but differs in that transparent film 14 having a refractive index substantially equal to that of $n^-$-type semiconductor layer 3 is provided on metal periodic structure member 4 to cover the entire periodic structure of the surface of metal periodic structure member 4. The provision of transparent film 14 decreases the reflection of light on the outlet side of aperture 6. For example, when a photodiode is constructed for signal light having a wavelength of 1300 nm, germanium that has been doped with antimony is used as $n^-$-type semiconductor layer 3 and silicon or SiGe is used as transparent film 14 to realize this configuration. In the configuration shown in FIG. 14, transparent film 14 is covered by antireflection film 13 to obtain a further reduction of reflection. A material having a refractive index close to the square root of the refractive index of transparent film 14 is preferably used for antireflection film 13. When silicon is used as transparent film 14, $HfO_2$ or $Ta_2Or$ can be used for antireflection film 13.

Second Embodiment

Figure 15:
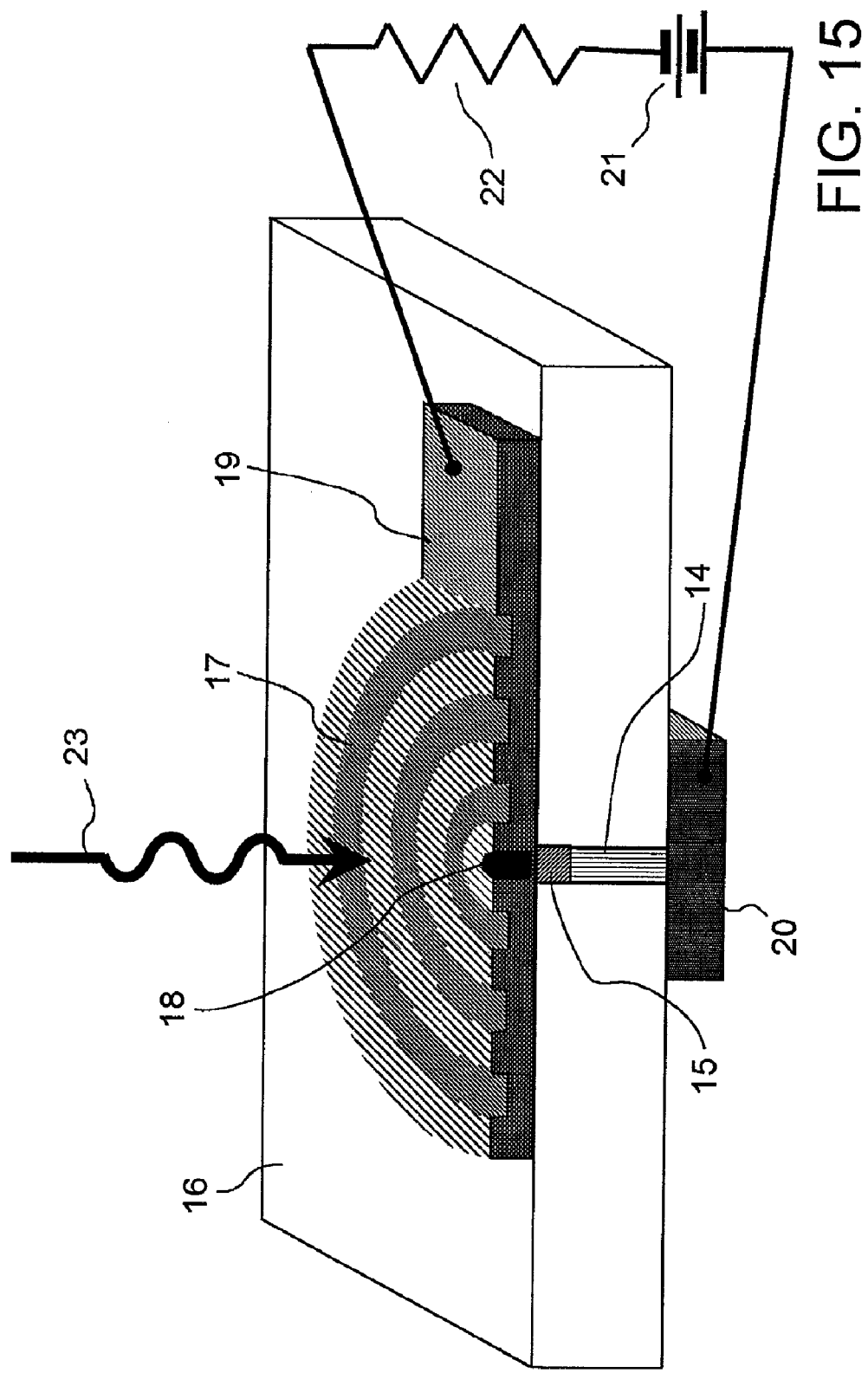
FIG. 15 is a sectional perspective view showing the configuration of a Schottky photodiode according to a second embodiment of the present invention.

Explanation next regards the Schottky photodiode according to the second embodiment of the present invention. The photodiode of the first embodiment was of the planar type, but the photodiode of this second embodiment uses an insulating substrate and arranges the first electrode on the front surface of the substrate and the second electrode on the rear surface. FIG. 15 shows the configuration of a photodiode that is the second embodiment.

As in the case of the first embodiment, on the surface of insulating substrate 16, aperture 18 is provided at the center and metal periodic structure member 17 having a periodic structure realized by concentric surface irregularities is formed around aperture 18. As with the photodiode shown in FIGS. 4 to 6, aperture 18 does not completely penetrate metal periodic structure member 17. First electrode (anode electrode) 19 that is electrically connected to metal periodic structure member 17 is further provided on the surface of substrate 16.

A through-hole is formed in substrate 16 corresponding to the position of aperture 16, and second electrode (cathode electrode) 20 is provided on the surface on the opposite side of substrate 16 with this through-hole interposed. $N^+$-type semiconductor layer 14 for ohmic conjunction with second electrode 20 and $n^-$-type semiconductor layer 15 that is formed on $n^+$-type semiconductor layer 14 are provided in the through-hole formed in substrate 16. $N^-$-type semiconductor layer 15 reaches the surface of substrate 16 and connects with metal periodic structure member 17.

In this photodiode, the configurations and shapes described in the second to seventh examples in the first embodiment can be used for metal periodic structure member 17 and each of electrodes 19 and 20.

First electrode 19 and second electrode 20 are connected to bias power supply 21 by way of load resistance 22, and a reverse bias voltage is applied to this photodiode from bias power supply 21.

When silicon is used as the semiconductor material in this photodiode, $n^+$-type semiconductor layer 14 and $n^-$-type semiconductor layer 15 are formed by adjusting the arsenic that is doped in the silicon. Silver can be used for electrodes 19 and 20. In this photodiode as well, setting the period of the concentric surface irregularities of metal periodic structure member 17 to 700 nm produces conspicuous plasmon resonance when the wavelength of incident signal light is in the neighborhood of 800 nm, and the intensity of near-field light that appears from the vicinity of aperture 18 on the side of $n^-$-type semiconductor layer 15 is both dramatically increased and closely confined to the vicinity of the outlet side of aperture 18. As a result, a photodiode that exhibits high quantum efficiency can be obtained in the second embodiment as in the case of the first embodiment.

Third Embodiment

Figure 16:
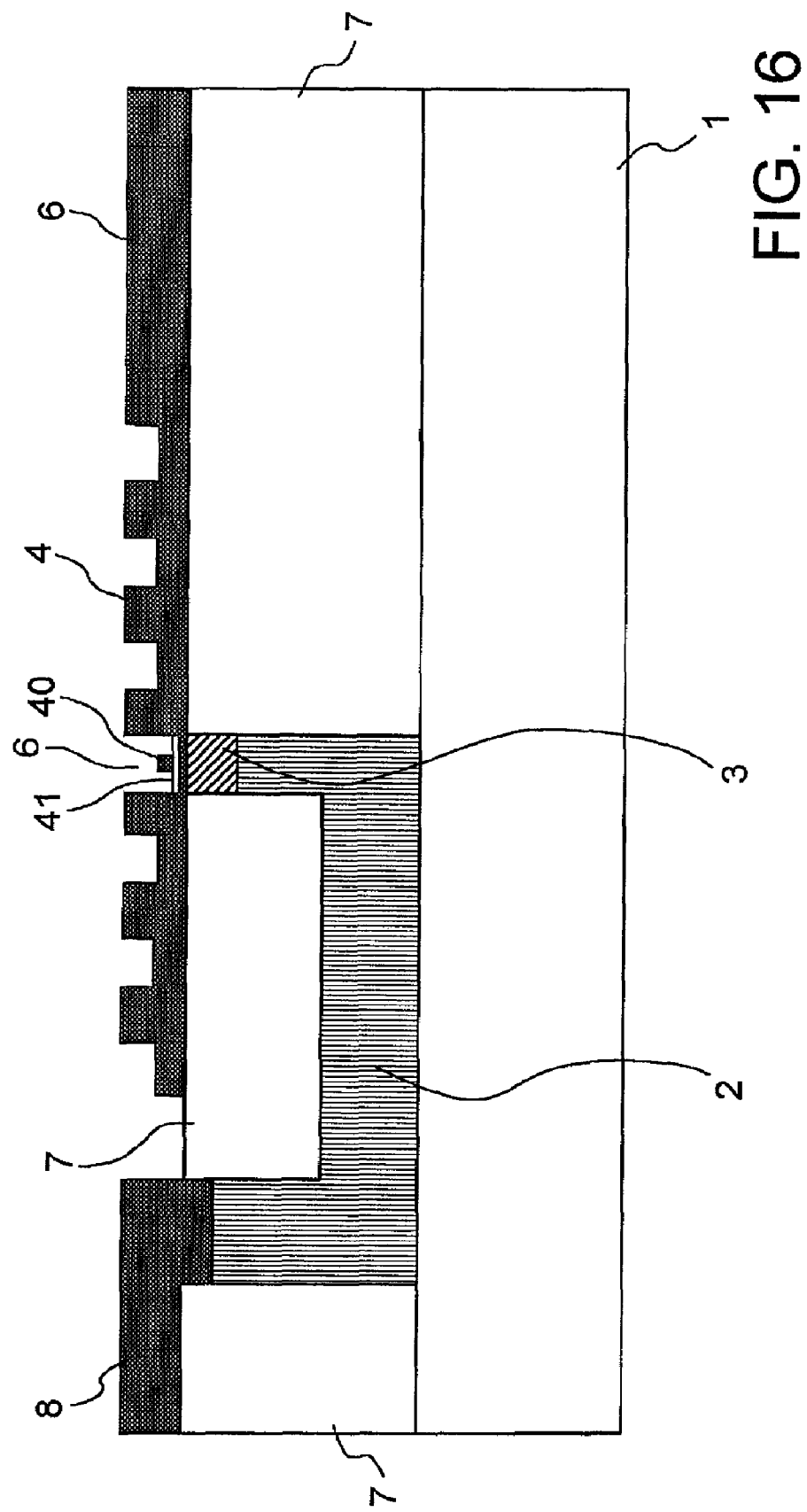
FIG. 16 is an enlarged sectional view showing the configuration of a Schottky photodiode according to a third embodiment of the present invention.

Explanation next regards the Schottky photodiode according to the second embodiment of the present invention. The photodiode of the third embodiment shown in FIG. 16 is similar to the photodiode of the first embodiment but differs in that minute scattering member 40 for scattering light is provided on the bottom surface of aperture 6 provided in metal periodic structure member 4. As the material for this scattering member 40, a material in which the electrical resistance is low in the region of the wavelength of light is appropriate, and the same metal material as used for metal periodic structure member 4, for example, silver, gold or the like, can be used. The volume and shape of scattering member 40 has an influence on the state of surface plasmon resonance, scattering members 40 of sizes ranging from about 5 nm square to the same order as the wavelength of incident light exhibiting a broad range of effects. Scattering member 40 can have, for example, a cylindrical or square rod shape.

Providing scattering member 40 on the bottom surface of aperture 6 enables a decrease of the components of propagated light on the outlet side of aperture 6 while increasing the diameter of aperture 6 to increase the near-field light. More specifically, aperture 6 can be increased in size within a range in which the distance between scattering member 40 and the inner walls of aperture 6 does not exceed half the wavelength of the incident light. In addition, scattering member 40 and the bottom surface of aperture 6 need not be in contact and may be separated by a minute distance no greater than the wavelength of incident light. In the device shown in the figure, scattering member 40 is arranged on the metal film that makes up the bottom surface of aperture 6 with thin dielectric layer 41 interposed. Alternatively, the aperture may completely penetrate the conductor, and the mode of the penetrating aperture can also be applied in the configuration shown in FIG. 13.

Figure 17:
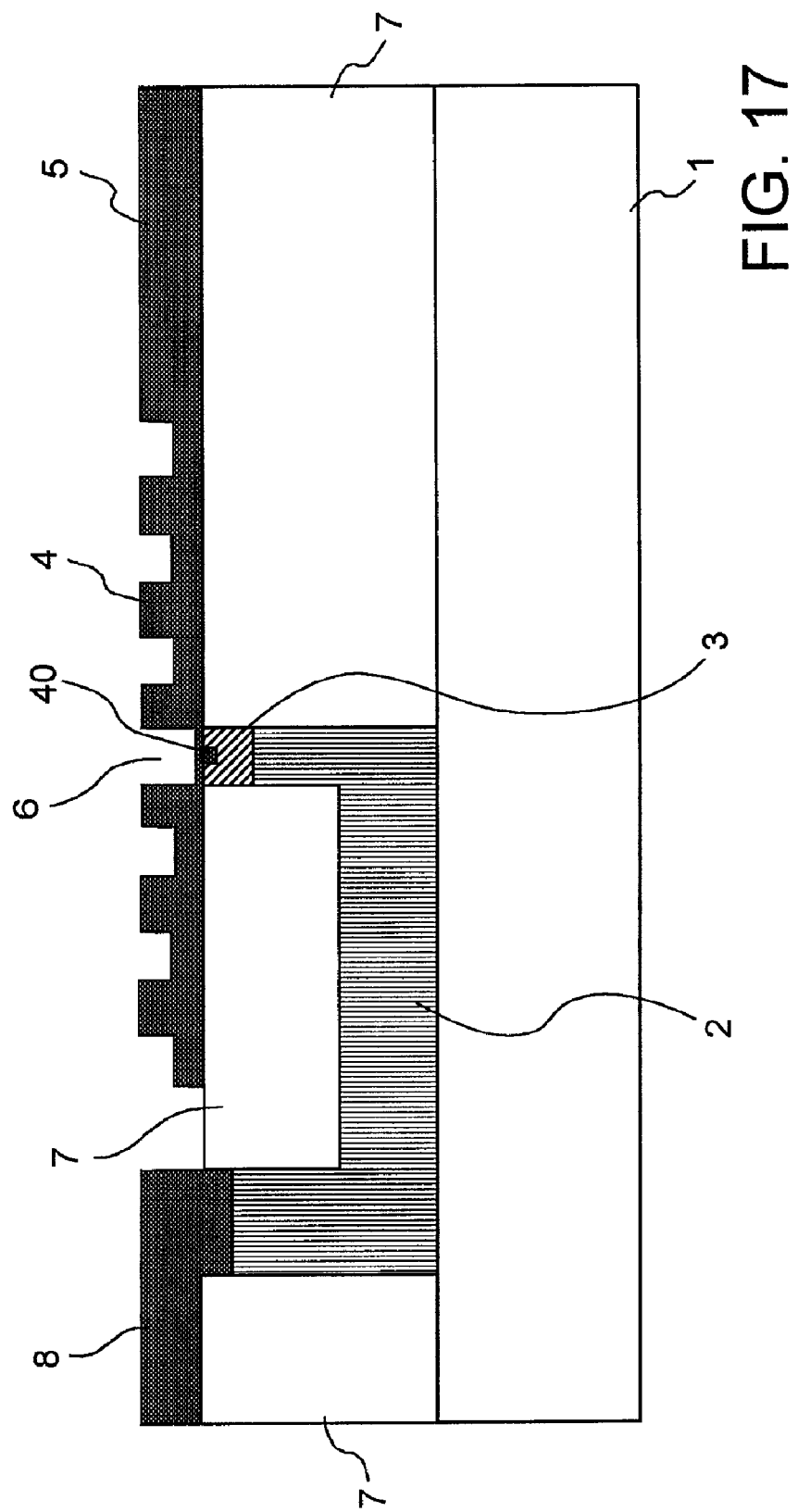
FIG. 17 is an enlarged sectional view showing a second example of the Schottky photodiode of the third embodiment.

FIG. 17 shows a second example of the photodiode in the third embodiment. This photodiode differs from the photodiode shown in FIG. 16 in that minute scattering member 40 is embedded in the uppermost surface of n$^-$-type semiconductor layer 3. A material having a low electrical resistance in the region of the wavelength of light is again appropriate for this scattering member 40, and the same metal material such as silver or gold that was used in metal periodic structure member 4 can be used. In this example as well, the volume and shape of scattering member 40 affects the state of a surface plasmon resonance, and scattering member 40 varying in size from about 5 nm square to the same order as the wavelength of incident light exhibits effects over a broad range. When scattering member 40 is provided in n$^-$-type semiconductor layer 3 in contact with the metal layer of the bottom surface of aperture 6 in this photodiode, the components of propagated light are decreased and a stronger near-field light can be produced in the semiconductor layer in the vicinity of the Schottky junction.

The same effects as previously described can also be obtained for a photodiode of a configuration in which aperture 6 completely penetrates metal periodic structure member 4 by arranging scattering member 40 in this aperture 6 or by embedding scattering member 40 in the uppermost surface of n$^-$-type semiconductor layer 3.

Fourth Embodiment

Figure 18:
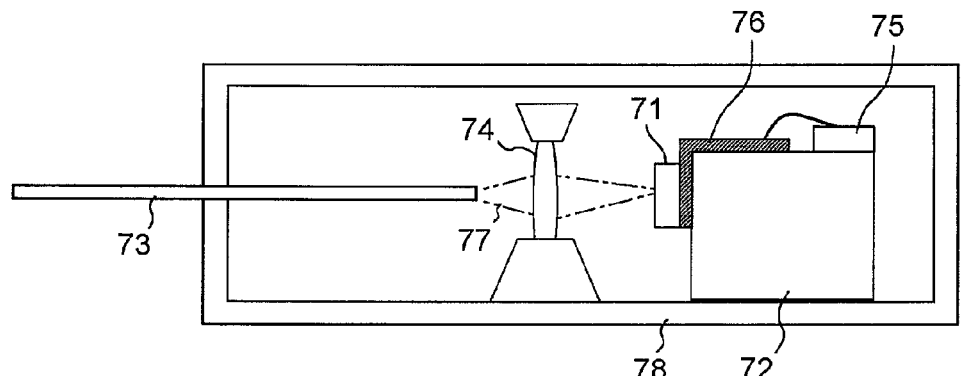
FIG. 18 is a schematic sectional view showing the configuration of an optical reception module according to a fourth embodiment of the present invention.

Explanation next regards an example of the application of the Schottky photodiode of the present invention. FIG. 18 shows a photoreception module for 40 Gbps (gigabits per second) transmission that uses the Schottky photodiode of the present invention.

Optical fiber 73 is led from the outside into module case 78. In module case 78, photodiode 71 based on the present invention is arranged to confront the end surface of optical fiber 73, and lens 74 for optically coupling optical fiber 73 and photodiode 71 and focusing signal light 77 emitted from optical fiber 73 upon the photoreception surface of photodiode 71 is provided between the end surface of optical fiber 73 and photodiode 71. Photodiode 71 is provided on the side surface of chip carrier 72 and is connected by way of electrical wiring 76 to preamplifier IC (integrated circuit) 75 that is provided on the upper surface of chip carrier 72. Photodiode 71 converts signal light 77 to electrical signals, and supplies the electrical signals to preamplifier IC 75 by way of electrical wiring 76. Preamplifier IC 75 amplifies the electrical signals that have been applied as input.

Photodiode 71 is formed by using a substrate in which an InGaAs film is formed on InP using epitaxial growth, and has a metal periodic structure member composed of silver or gold on the InGaAs film. When this photodiode is used in transmission by infrared light having a wavelength of 1.55 µm, the period of the surface irregularities on the metal periodic structure member may be set to approximately 1.2 µm, and when eight periods of concentric ring-shaped surface irregularities are formed, the diameter of the outer circumference is approximately 20 µm. The depth of the surface irregularities in the metal periodic structure member is preferably on the order of 0.1 to 0.4 µm, and the diameter of the aperture is preferably on the order of 0.3 to 0.7 µm.

In a photoreception module for 40 Gbps transmission of the prior art, a photodiode of a side-face incident waveguide type is frequently employed as the photodiode that is mounted inside the module case. The reason for this is that a high absorption efficiency cannot be obtained when the thickness of the absorption layer is reduced for decreasing the charge carrier transit time in a surface-incident type of photodiode in which light is irradiated on a semiconductor surface. On the other hand, by absorbing light in an in-plane direction of the absorption layer, the waveguide type obtains a high absorption efficiency with a short charge carrier transit time. However, in waveguide-type device for 40 Gbps, the thickness of the absorption layer is normally 1 µm or less, and the coupling tolerance relating to the alignment of the positions of the photodiode and optical fiber must be on the order of ±1 µm. A photoreception module that uses a photodiode of the prior art therefore entails serious problems from the standpoints of both package design and fabrication costs.

In contrast, a photodiode according to the present invention has an effective diameter of 20 µm at the light-receiving surface, and therefore, the coupling tolerance can be ±2 µm or more. As a result, the optical coupling of the optical fiber and photodiode can be carried out by simple lens coupling, and costs can therefore be cut for the photoreception module for transmission. In the photoreception module for 40 Gbps transmission shown in FIG. 18, a minimum reception sensitivity of −12 dBm was obtained when transmitting a wavelength of 1.55 µm. It was confirmed that, by using the photodiode of the present invention, a photoreception module could be realized at a level that, in terms of characteristics, compared favorably with a photoreception module for 40 Gbps of the prior art in which a waveguide-type photodiode was mounted.

Fifth Embodiment

Figure 19:
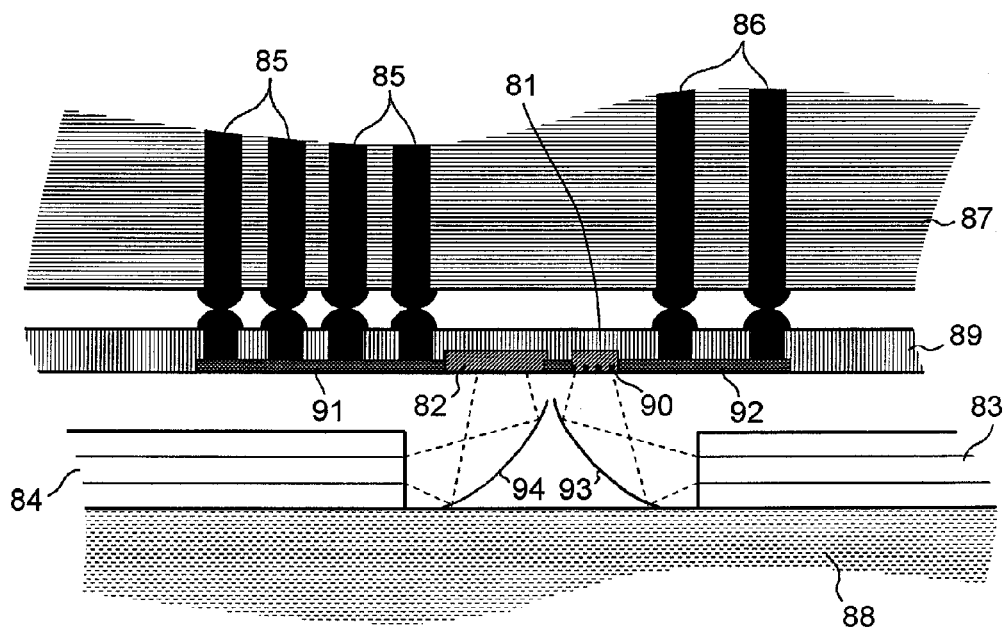
FIG. 19 is a schematic sectional view showing the configuration of an optical interconnection module according to a fifth embodiment of the present invention.

Explanation next regards another example of the application of the Schottky photodiode of the present invention. FIG. 19 shows an optical interconnection module for connection between LSI (Large-Scale Integration) chips in which the Schottky photodiode of the present invention is mounted.

The interconnection of LSI by optical fiber and the transmission of signals as optical signals are being investigated as a means of transmitting signals at high speed between LSI that are mounted on a wiring board. Signal processing within LSI is carried out for electrical signals and an optical interconnection module is therefore required for realizing connection between optical fibers and each of the LSI chips, converting signal light from optical fibers to electrical signals for input to an LSI chip, and for converting electrical signals supplied from LSI chips to light signals and introducing these signals to fibers.

Photodiode 81 based on the present invention and VCSEL (Vertical Cavity Surface Emitting Laser) light source 82 provided with electrical modulation structure are provided on one surface of mounting board 89, and metal periodic structure member 90 for enhancing the intensity of the near-field light by means of surface plasmon resonance is formed on the light-receiving surface of photodiode 81. Mounting board 89 is attached to the surface of LSI package 87 that incorporates an LSI chip. Vias 85 for the electrical wiring for the light source and modulation and vias 86 for the electrical wiring for the photodiode are formed in LSI package 87. Vias 85 are formed in mounting board 89 and are connected to electrical wiring layer 91 that is connected to VCSEL light source 82. Vias 86 are formed in mounting board 89 and are connected to electrical wiring layer 92 connected to photodiode 81.

LSI mounting board 88 is arranged to confront this mounting board 89. The surface of LSI mounting board 88 is provided with: optical fiber 83 for optical signal input, optical fiber 84 for optical signal output, concave mirror 93 for directing signal light emitted from the end surface of optical fiber 83 toward photodiode 81, and concave mirror 94 for directing signal light from VCSEL light source 82 toward optical fiber 84. Concave mirror 93 optically couples optical fiber 83 and photodiode 81, and concave mirror 94 optically couples optical fiber 84 and VCSEL light source 82.

In this type of optical interconnection module, signal light from fiber 83 for optical signal input is irradiated onto metal periodic structure member 90 by concave mirror 93. When light having a wavelength of 850 nm is used as the signal light, silicon is used as the semiconductor material used in photodiode 81 and the period of the surface irregularities in metal periodic structure member 90 is set to 600 nm to 700 nm. Photodiode 81 made from silicon generates a photocurrent by means of the near-field light that is produced by metal periodic structure member 90 and sends a current that corresponds to the optical signals to the LSI through vias 86 and electrical wiring layer 92 for the photodiode. By means of the function of metal periodic structure member 90, the coupling tolerance relating to the positions of concave mirror 93 and the photodiode can be set to ±1 μm or more. In this case, a preamplifier for amplifying the electrical signals can be provided midway through electrical wiring layer 92 at a position that immediately follows photodiode 81.

Electrical signals from LSI pass from vias 85 and through electrical wiring layer 91 to be converted to optical signals by VCSEL light source 82 that is provided with an electrical modulation structure. The optical signals are reflected by concave mirror 94 and thus introduced to optical fiber 84 for optical signals. VCSEL light source 82 provided with the electrical modulation structure can be replaced by another known structure for modulating light by electrical signals such as a Mach-Zehnder modulator for modulating light from an outside light source by an electrooptic effect or by a thermooptic effect.

Another well-known construction such as a planar optical waveguide can be used in place of optical fiber for the input of optical signals in the optical interconnection module described in the foregoing explanation. In addition, a condensing structure such as a convex lens can also be used in place of concave mirror 93.

When high-speed operation of 20 GHz or more is the object in an optical interconnection module of the prior art used for connection between LSI chips, a compound semiconductor material such as InGaAs grown on an InP substrate is used to achieve high-speed response as the photodiode for photoreception. This type of compound semiconductor is difficult to match to the fabrication processes of silicon semiconductor devices, and as a result, optical interconnection modules of the prior art entailed the problem of high fabrication costs.

In contrast, an optical interconnection module of the present embodiment uses a photodiode according to the present invention that uses silicon as the semiconductor material, and fabrication costs can therefore be reduced. It has been confirmed that when the optical interconnection module shown in FIG. 19 was actually fabricated, high-speed optoelectrical conversion operation of approximately 40 GHz was realized.

Other Embodiments

Although the foregoing explanation has regarded preferable embodiments of the present invention, it will be obvious that in each of the above-described embodiments, technology well known in the prior art can be combined with the techniques of the present invention such as the condensing of incident light by a lens and the subsequent irradiation of the light onto a metal periodic structure member.

The planar shape of the aperture provided in metal periodic structure member is not necessarily limited to a circle or a slit, and can also be an oval, an ellipse, a dumbbell, or even a square or rectangle, and the same effects as described above can be obtained even when an aperture of these shapes is used. A plurality of apertures arranged in proximity can also be used in place of a single aperture.

Regarding the shape along the direction of depth of the aperture, the above-described embodiments included a configuration in which the aperture does not penetrate the metal periodic structure member and a metal layer remains on the bottom surface of the aperture, a configuration having a conductive optical scattering member on the bottom surface of the aperture, and a configuration in which the metal periodic structure member is completely penetrated and the aperture has no bottom surface. However, the sectional shape of the aperture is not limited to these forms, and apertures of various other sectional shapes can be selected in each of the above-described examples. Accordingly, any combination of the planar shape and sectional shape of the aperture is possible including the forms shown in the examples.

The invention claimed is:
1. An optical interconnection module comprising:
   a photodiode for receiving incident light emitted from a first optical fiber to generate a first signal;
   a light source for generating a signal light that is irradiated into a second optical fiber; and
   a mounting board on which said photodiode and said light source are arranged;
   wherein said first signal is supplied to an LSI, and said light source generates the signal light in accordance with a second signal from said LSI;
   said photodiode comprising:
      a conductive film having: an aperture having a diameter smaller than the wavelength of said incident light, and a periodic structure provided around said aperture for producing a resonant state by an excited surface plas- mon in a film surface of said conductive film by means of said incident light to said conductive film; and a semiconductor layer provided in a vicinity of said aperture of said conductive film and in contact with said conductive film;

wherein said photodiode detects near-field light that is generated at an interface between said conductive film and said semiconductor layer by said excited surface plasmon.

2. The photodiode according to claim 1, wherein said conductive film is a metal film through which said incident light does not pass at locations other than said aperture.

3. The photodiode according to claim 1, wherein a region in which a Schottky barrier formed by said conductive film and said semiconductor layer substantially matches a region of generation of said near-field light.

4. The photodiode according to claim 1, wherein said periodic structure is composed of surface irregularities having a period in a direction of increasing distance from said aperture.

5. The photodiode according to claim 1, wherein said conductive film has a first surface and a second surface, said aperture is formed from said first surface side; and said periodic structure is composed of surface irregularities having a period in a direction of increasing distance from said aperture;

said semiconductor layer is a first semiconductor layer of one conductive type and in contact with the second surface of said conductive film; and said photodiode further includes a second semiconductor layer of said one conductive type in which the concentration of impurities is higher than in said first semiconductor layer, and which contacts a surface of said first semiconductor layer that is opposite to another surface in contact with the second surface of said conductive film.

6. The photodiode according to claim 1, wherein said periodic structure is composed of concentric grooves that take said aperture as center.

7. The photodiode according to claim 1, wherein said aperture has a bottom surface portion that is a part of said conductive film.

8. The photodiode according to claim 1, wherein a scattering member composed of a conductive material for scattering light is arranged in said aperture.

9. The photodiode according to claim 1, wherein said aperture penetrates said conductive film and reaches said semiconductor layer, and of said conductive film, a periphery around said aperture contacts said semiconductor layer.

10. The optical interconnection module according to claim 1, further comprising:

a first optical coupler for optically coupling said first optical fiber and said photodiode; and a second optical coupler for optically coupling said light source and said second optical fiber.

11. The photodiode according to claim 5, wherein said conductive film is a metal film and the diameter of said aperture is at least 1/10 but no greater than 1/2 the wavelength of said incident light.

12. The photodiode according to claim 5, wherein a transparent film having an index of refraction substantially equal to that of said semiconductor layer is provided on said first surface of said conductive film.

13. The photodiode according to claim 6, wherein a thickness of said semiconductor layer is at least 50 nm but no greater than 100 nm.

14. The photodiode according to claim 7, comprising a scattering member composed of conductive material for scattering light, said scattering member being embedded in said semiconductor layer side extending from an interface between said bottom surface portion and said semiconductor layer corresponding to the position of said aperture.

15. The photodiode according to claim 7, wherein a thickness of said semiconductor layer is at least 50 nm but no greater than 100 nm.

16. The photodiode according to claim 9, wherein a scattering member composed of a conductive material for scattering light is embedded in a surface of said semiconductor layer corresponding to the position of said aperture.

17. The photodiode according to claim 11, wherein the period of said periodic structure is set to a resonant wavelength of the surface plasmon excited on said conductive film by said incident light.

18. The photodiode according to claim 11, wherein the period of said periodic structure is equal to or less than the wavelength of said incident light.

19. The photodiode according to claim 11, wherein said metal film has a thickness no greater than 1000 nm but at least 100 nm at concave portions of said periodic structure, and a depth of said surface irregularities is at least 20 nm but no greater than 200 nm.

20. The photodiode according to claim 12, further comprising an antireflection film for incident light provided on said transparent film.

21. An optical interconnection module comprising:

a photodiode according to claim 5 for receiving incidence of light emitted from a first optical fiber to generate a first signal current;

a light source for generating a signal light that is irradiated into a second optical fiber; and a mounting board on which said photodiode and said light source are arranged;

wherein said first signal current is supplied to an LSI, and said light source generates the signal light in accordance with the second signal current from said LSI.

22. The optical interconnection module according to claim 21, further comprising:

a first optical coupler for optically coupling said first optical fiber and said photodiode; and a second optical coupler for optically coupling said light source and said second optical fiber.

23. An optical module, comprising:

a photodiode for detecting signal light emitted from an optical fiber to supply it as an electrical signal;

a preamplifier for amplifying the electrical signal;

a case; and an optical coupler for optically coupling said optical fiber and said photodiode;

wherein said photodiode and said preamplifier are accommodated in said case; and wherein said photodiode comprises:

a conductive film having, an aperture having a diameter smaller than wavelength of incident light, and a periodic structure provided around said aperture for producing a resonant state by an excited surface plasmon in a film surface of said conductive film by means of the incident light to said conductive film; and a semiconductor layer provided in a vicinity of said aperture of said conductive film and in contact with said conductive film;

wherein said photodiode detects near-field light that is generated at an interface between said conductive film and said semiconductor layer by said excited surface plasmon; and wherein said conductive film has a first surface and a second surface, said aperture is formed from said first surface side; and said periodic structure is composed of surface irregularities having a period in a direction of increasing distance from said aperture;

said semiconductor layer is a first semiconductor layer of one conductive type and in contact with the second surface of said conductive film; and, said photodiode further includes a second semiconductor layer of said one conductive type in which the concentration of impurities is higher than in said first semiconductor layer, and which contacts a surface of said first semiconductor layer that is opposite to another surface in contact with the second surface of said conductive film.

24. An optical interconnection module, comprising:
a photodiode for receiving incidence of light emitted from a first optical fiber to generate a first signal current;
a light source for generating a signal light that is irradiated into a second optical fiber; and
a mounting board on which said photodiode and said light source are arranged;
wherein said first signal current is supplied to an LSI, and said light source generates the signal light in accordance with the second signal current from said LSI;
a first optical coupler for optically coupling said first optical fiber and said photodiode; and
a second optical coupler for optically coupling said light source and said second optical fiber;
said photodiode comprising:
  a conductive film having: an aperture having a diameter smaller than wavelength of incident light, and a periodic structure provided around said aperture for producing a resonant state by an excited surface plasmon in a film surface of said conductive film by means of the incident light to said film surface; and
  a semiconductor layer provided in a vicinity of said aperture of said conductive film and in contact with said conductive film;
  wherein said photodiode detects near-field light that is generated at an interface between said conductive film and said semiconductor layer by said excited surface plasmon; and
wherein said conductive film has a first surface and a second surface, said aperture is formed from said first surface side; and
  said periodic structure is composed of surface irregularities having a period in a direction of increasing distance from said aperture;
  said semiconductor layer is a first semiconductor layer of one conductive type and in contact with the second surface of said conductive film; and
  said photodiode further includes a second semiconductor layer of said one conductive type in which the concentration of impurities is higher than in said first semiconductor layer, and which contacts a surface of said first semiconductor layer that is opposite to another surface in contact with the second surface of said conductive film.

25. An optical interconnection module comprising:
a photodiode for receiving incidence of light emitted from a first optical fiber to generate a first signal current;
a light source for generating a signal light that is irradiated into a second optical fiber; and
a mounting board on which said photodiode and said light source are arranged;
wherein said first signal current is supplied to an LSI, and said light source generates the signal light in accordance with the second signal current from said LSI; and,
said photodiode comprising:
  a conductive film having: an aperture having a diameter smaller than wavelength of incident light, and a periodic structure provided around said aperture for producing a resonant state by an excited surface plasmon in a film surface of said conductive film by means of the incident light to said film surface; and
  a semiconductor layer provided in a vicinity of said aperture of said conductive film and in contact with said conductive film;
  wherein said photodiode detects near-field light that is generated at an interface between said conductive film and said semiconductor layer by said excited surface plasmon in a depletion region formed at the interface of said conductive film and said semiconductor layer.

26. The optical interconnection module according to claim 25, further comprising:
a first optical coupler for optically coupling said first optical fiber and said photodiode; and
a second optical coupler for optically coupling said light source and said second optical fiber.

27. An optical module comprising:
a photodiode according to claim 25 for detecting signal light emitted from an optical fiber to supply it as an electrical signal; and
a preamplifier for amplifying the electrical signal.

28. The optical module according to claim 27, comprising:
a case; and
an optical coupler for optically coupling said optical fiber and said photodiode;
wherein said photodiode and said preamplifier are accommodated in said case.

29. An optical interconnection module comprising:
a photodiode for receiving incidence of light emitted from a first optical fiber to generate a first signal current;
a light source for generating a signal light that is irradiated into a second optical fiber; and
a mounting board on which said photodiode and said light source are arranged;
wherein said first signal is supplied to an LSI, and said light source generates the signal light in accordance with a second signal from said LSI; and,
said photodiode comprising:
  a metal semiconductor junction forming a depletion region in the presence of an applied junction voltage across a metal-semiconductor junction having a metal side;
  the junction positioned to receive near field light generated from incident light striking the photodiode from the metal side of the junction through a sub-wavelength aperture due to surface plasmon resonance, and the metal side of the junction comprising a metal film through which said incident light does not pass at locations other than said sub-wavelength aperture, and which metal-semiconductor junction substantially matches a region of generation of said near-field light; and wherein said surface plasmon resonance results from a periodic structure on said metal side of said metal-semiconductor junction composed of surface irregularities having a period in a direction of increasing distance from said sub-wavelength aperture.

* * * * *